(12) United States Patent
Fujiu et al.

(10) Patent No.: US 12,080,374 B2
(45) Date of Patent: Sep. 3, 2024

(54) SEMICONDUCTOR STORAGE DEVICE

(71) Applicant: KIOXIA CORPORATION, Tokyo (JP)

(72) Inventors: Masaki Fujiu, Yokohama Kanagawa (JP); Hitoshi Shiga, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 80 days.

(21) Appl. No.: 17/898,888

(22) Filed: Aug. 30, 2022

(65) Prior Publication Data

US 2023/0267972 A1 Aug. 24, 2023

(30) Foreign Application Priority Data

Feb. 24, 2022 (JP) ................... 2022-026486

(51) Int. Cl.
*G11C 7/06* (2006.01)
*G11C 7/12* (2006.01)
*G11C 7/22* (2006.01)

(52) U.S. Cl.
CPC ............... *G11C 7/065* (2013.01); *G11C 7/12* (2013.01); *G11C 7/222* (2013.01)

(58) Field of Classification Search
CPC .......... G11C 7/065; G11C 7/12; G11C 7/222; G11C 7/062; G11C 7/1051
See application file for complete search history.

(56) References Cited

U.S. PATENT DOCUMENTS

| | | | |
|---|---|---|---|
| 9,792,995 B1 | 10/2017 | Shah et al. | |
| 10,706,940 B2 | 7/2020 | Handa et al. | |
| 2010/0208519 A1 | 8/2010 | Shiga et al. | |
| 2013/0235676 A1 | 9/2013 | Takagiwa | |
| 2015/0262630 A1 | 9/2015 | Shirakawa et al. | |
| 2016/0247549 A1 | 8/2016 | Takagiwa | |
| 2016/0365154 A1 | 12/2016 | Nagadomi | |
| 2019/0348131 A1* | 11/2019 | Watanabe | G11C 16/26 |
| 2021/0377474 A1* | 12/2021 | Ryu | H04N 25/76 |

FOREIGN PATENT DOCUMENTS

| | | |
|---|---|---|
| JP | 2010-192049 A | 9/2010 |
| JP | 2015-176309 A | 10/2015 |
| JP | 2019-117676 A | 7/2019 |
| TW | I618080 B | 3/2018 |

* cited by examiner

*Primary Examiner* — Han Yang
(74) *Attorney, Agent, or Firm* — Kim & Stewart LLP

(57) ABSTRACT

A semiconductor storage device includes a memory string, a sense amplifier connected to the memory string, first, second, third, and fourth latch circuits that are each connected to the sense amplifier, a first wiring connected to the sense amplifier, the first latch circuit and the second latch circuit, a second wiring connected to the third latch circuit, a third wiring connected to the fourth latch circuit, a first switch transistor between the first wiring and the third wiring, a second switch transistor between the first wiring and the second wiring, and a third switch transistor between the second wiring and the third wiring.

19 Claims, 29 Drawing Sheets

SEMICONDUCTOR STORAGE DEVICE

CROSS-REFERENCE TO RELATED APPLICATION(S)

This application is based upon and claims the benefit of priority from Japanese Patent Application No. 2022-026486, filed Feb. 24, 2022, the entire contents of which are incorporated herein by reference.

FIELD

Embodiments described herein relate generally to a semiconductor storage device.

BACKGROUND

A semiconductor storage device that includes a memory cell array including a plurality of memory cells and a plurality of bit lines connected to the memory cells, and a plurality of sense amplifier units respectively connected to the bit lines, is known.

DETAILED DESCRIPTION

In general, according to one embodiment, a semiconductor storage device includes a memory string, a bit line connected to the memory string, a sense amplifier connected to the bit line, first, second, third, and fourth latch circuits that are each connected to the sense amplifier, a first wiring connected to the sense amplifier, the first latch circuit and the second latch circuit, a second wiring connected to the third latch circuit, a third wiring connected to the fourth latch circuit, a first switch transistor between the first wiring and the third wiring, a second switch transistor between the first wiring and the second wiring, and a third switch transistor between the second wiring and the third wiring.

Next, semiconductor storage devices according to embodiments will be described in detail with reference to the drawings. It is noted that the following embodiments are merely examples, and are not described for the purpose of limiting the disclosure.

In this description, when a term "semiconductor storage device" is used, the semiconductor storage device may mean a memory die, and may also mean a memory system that includes a controller die, such as a memory chip, a memory card, and an SSD. Further, the semiconductor storage device may mean a structure that includes a host computer, such as a smart phone, a tablet terminal, or a personal computer.

In the description, when a first structure is referred to as "electrically connected" to a second structure, the first structure may be directly connected to the second configuration, and may also be connected to the second structure via a wiring, a semiconductor member, a transistor, or the like. For example, when three transistors are connected in series, even when the second transistor is in an OFF state, the first transistor is "electrically connected" to the third transistor.

In the description, when the first structure is referred to as being "connected between" the second structure and the third structure, it may mean that the first structure, the second structure, and the third structure are connected in series, and the first structure is provided in a current path that extends between the second structure and the third structure.

In addition, in the description, when a circuit or the like is referred to as "conducting" two wirings or the like, it may mean that, for example, the circuit or the like includes a transistor or the like, which is provided in a current path between the two wirings, and the transistor or the like is in an ON state.

[First Embodiment]

[Memory System 10]

Figure 1:
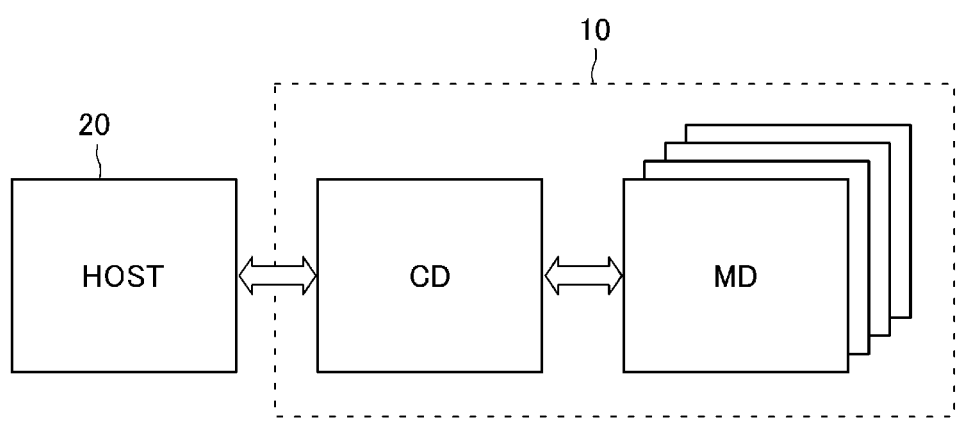
FIG. 1 is a schematic block diagram showing a configuration of a memory system according to a first embodiment.

FIG. 1 is a schematic block diagram showing a configuration of the memory system 10 according to the first embodiment.

The memory system 10 reads, writes, and erases user data in response to signals transmitted from a host computer 20. That is, the memory system 10 executes a read operation, a write operation, and an erase operation. The memory system 10 is, for example, a memory chip, a memory card, an SSD, or other systems capable of storing user data. The memory system 10 includes a plurality of memory dies MD that store the user data, and a controller die CD connected to the memory dies MD and the host computer 20. The controller die CD includes, for example, a processor, a RAM, a ROM, and an ECC circuit, and performs processing such as conversion between a logical address and a physical address, bit error detection/correction, and wear leveling.

Figure 2:
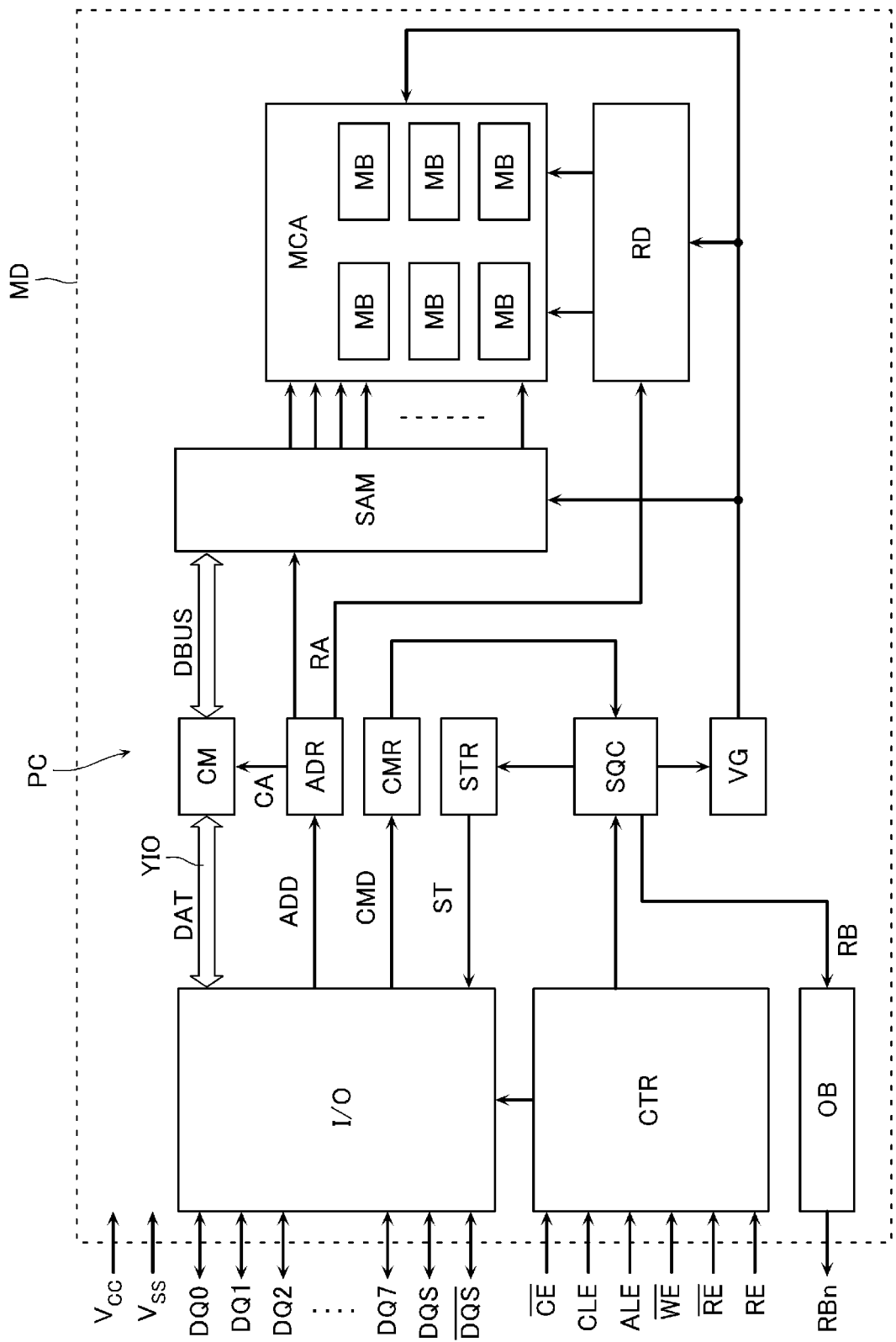
FIG. 2 is a schematic block diagram showing a configuration of a memory die.
Figure 3:
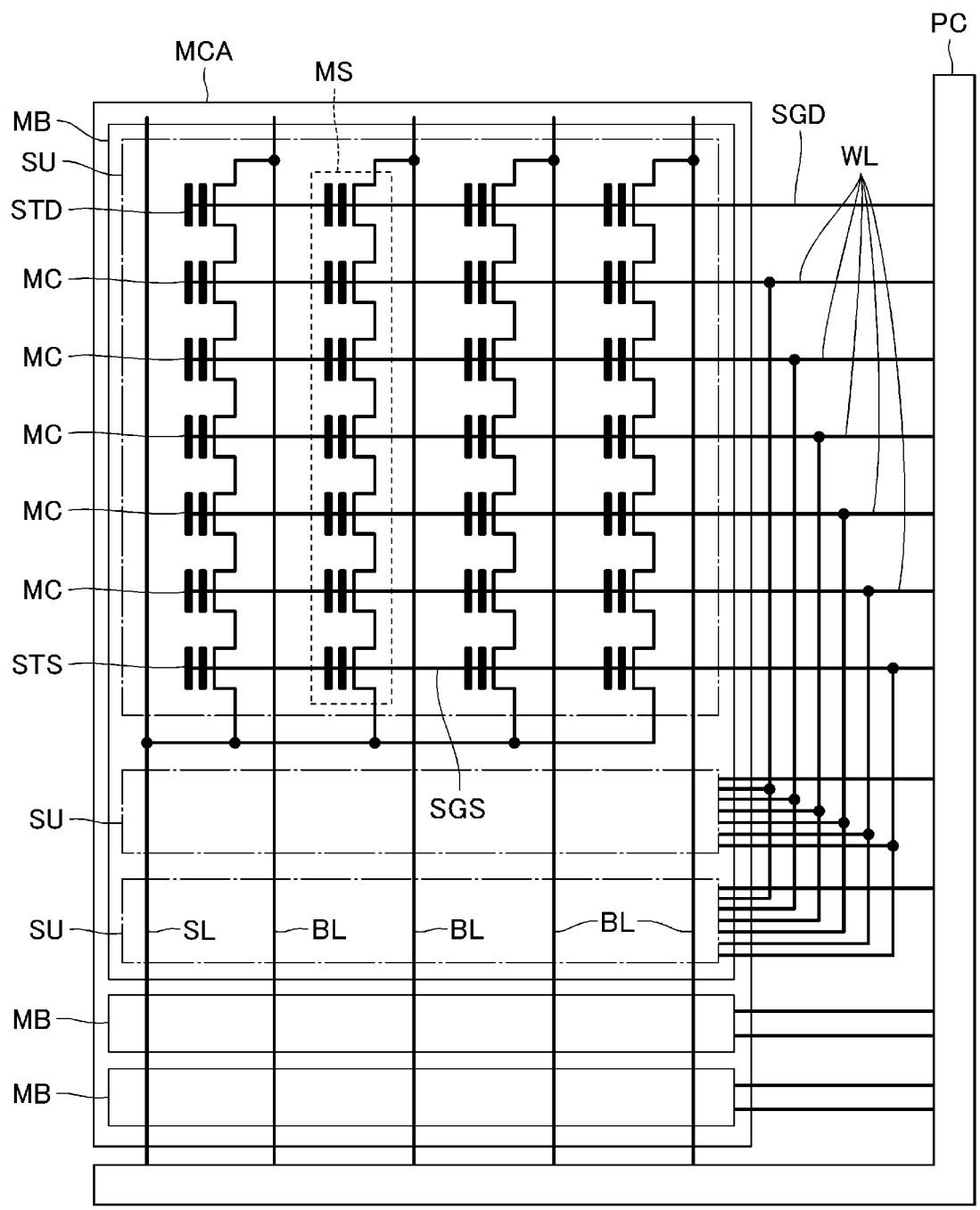
FIG. 3 is a schematic circuit diagram showing a configuration of a memory cell array.
Figure 4:
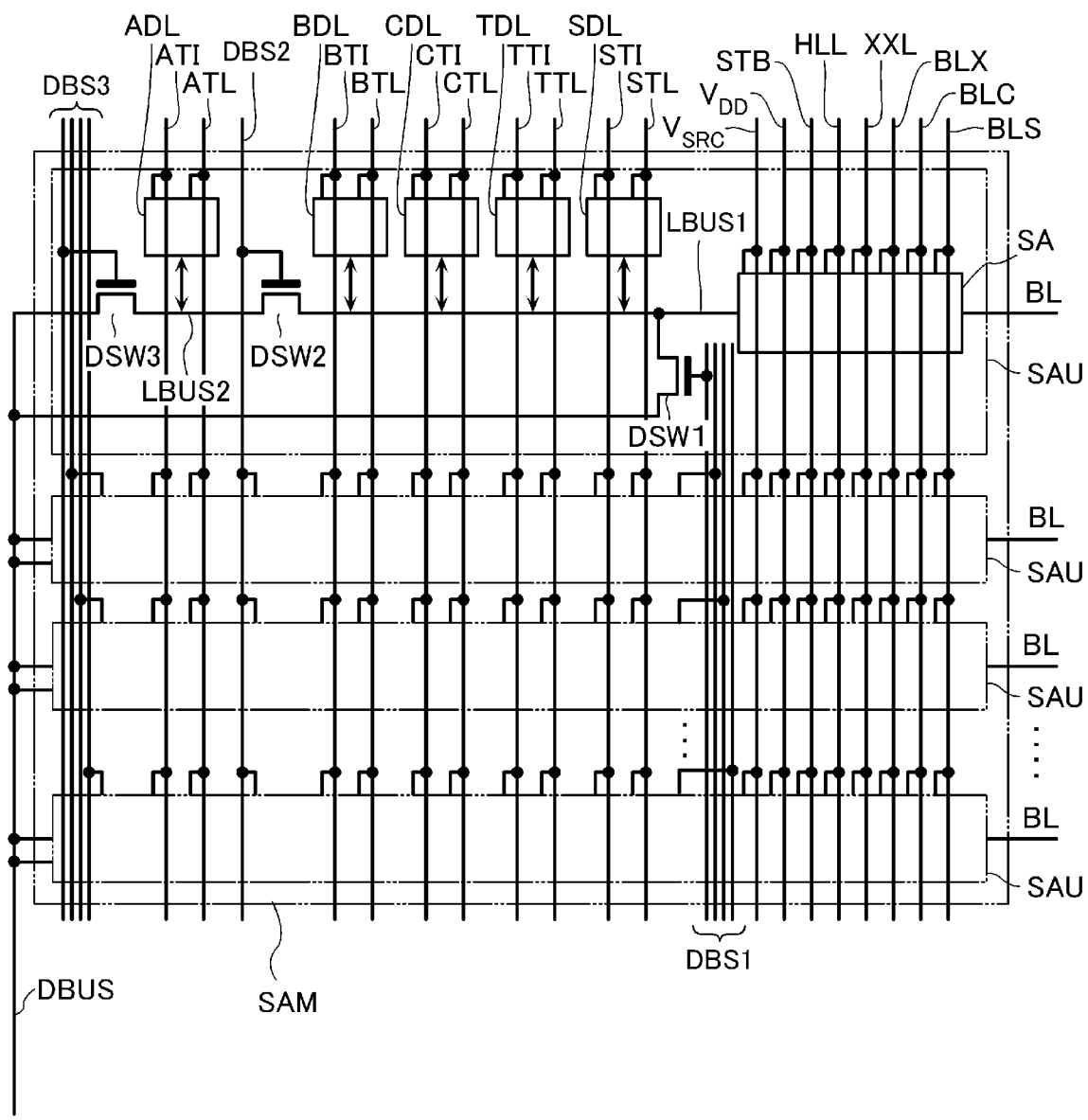
FIG. 4 is a schematic block diagram showing a configuration of a sense amplifier module.
Figure 5:
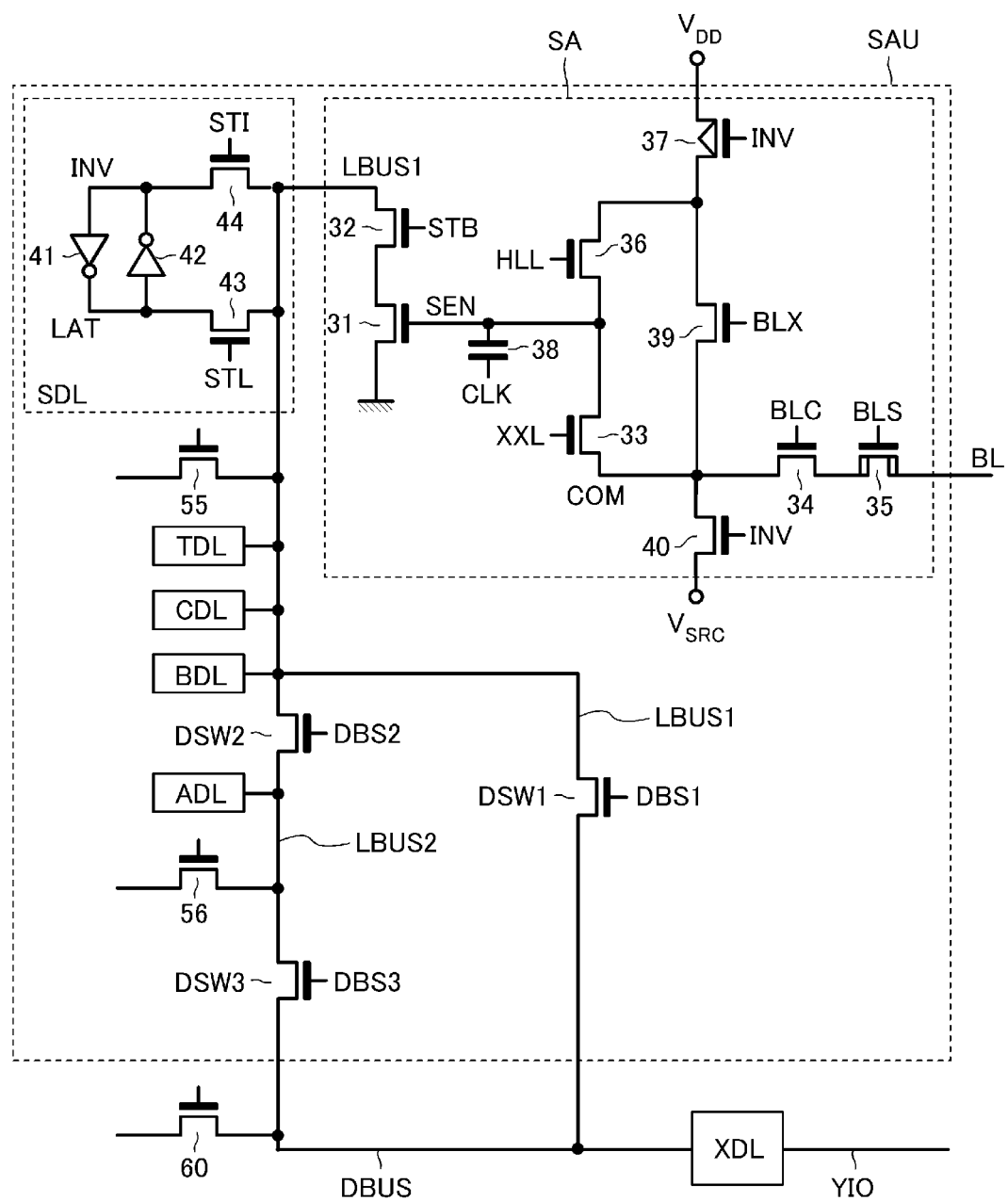
FIG. 5 is a schematic circuit diagram showing a configuration of a sense amplifier unit.

FIG. 2 is a schematic block diagram showing a configuration of the memory die MD according to the first embodiment. FIGS. 3 to 5 are schematic circuit diagrams showing a part of the configuration of the memory die MD.

As shown in FIG. 2, the memory die MD includes a memory cell array MCA that stores data and a peripheral circuit PC connected to the memory cell array MCA.

[Memory Cell Array MCA]

The memory cell array MCA includes a plurality of memory blocks MB. Each of the memory blocks MB includes a plurality of string units SU as shown in FIG. 3. Each of the string units SU includes a plurality of memory strings MS. One end of each of the memory strings MS is connected to the peripheral circuit PC via a bit line BL. The other end of each of the memory strings MS is connected to the peripheral circuit PC via a common source line SL.

The memory string MS includes a drain select transistor STD, a plurality of memory cells MC, and a source select transistor STS that are connected in series between the bit line BL and the source line SL. Hereinafter, the drain select transistor STD and the source select transistor STS may be simply referred to as select transistors (STD, STS).

The memory cell MC according to the present embodiment is a field effect transistor (and thus also referred to as a memory transistor) that includes a semiconductor layer functioning as a channel region, a gate insulating film including a charge storage film, and a gate electrode. A threshold voltage of the memory cell MC changes according to an amount of charge in the charge storage film. The memory cell MC stores 1-bit or multiple-bit data. Word lines WL are connected to gate electrodes of a plurality of memory cells MC corresponding to one memory string MS. The word lines WL are commonly connected to all memory strings MS in one memory block MB.

The select transistors (STD, STS) are field effect transistors that each include a semiconductor layer functioning as a channel region, a gate insulating film, and a gate electrode. Select gate lines (SGD, SGS) are connected to the gate electrodes of the select transistors (STD, STS), respectively. A different drain select gate line SGD is provided for each string unit SU, and is commonly connected to all the memory strings MS in one string unit SU. The source select gate line SGS is commonly connected to all the memory strings MS in one memory block MB.

[Peripheral Circuit PC]

As shown in FIG. 2, the peripheral circuit PC includes a row decoder RD, a sense amplifier module SAM, a cache memory CM, a voltage generation circuit VG, and a sequencer SQC. In addition, the peripheral circuit PC includes an address register ADR, a command register CMR, and a status register STR. The peripheral circuit PC also includes an input and output control circuit I/O, a logical circuit CTR, and an output buffer OB.

The row decoder RD includes, for example, a decode circuit and a switch circuit. The decode circuit decodes a row address RA stored in the address register ADR. In response to an output signal of the decode circuit, the switch circuit makes the word line WL and the select gate lines (SGD, SGS) corresponding to the row address RA conductive with a corresponding voltage supply line.

As shown in FIG. 4, the sense amplifier module SAM includes a plurality of sense amplifier units SAU, each corresponding to one of a plurality of bit lines BL. Each of the sense amplifier units SAU includes a sense amplifier SA connected to the bit line BL, a wiring LBUS1 connected to the sense amplifier SA, latch circuits SDL, BDL, CDL, and TDL connected to the wiring LBUS1, a charge transistor 55 for precharging (FIG. 5) connected to the wiring LBUS1, and switch transistors DSW1, DSW2 connected to the wiring LBUS1. Further, each of the sense amplifier units SAU includes a wiring LBUS2 connected to the switch transistor DSW2, a latch circuit ADL connected to the wiring LBUS2, a charge transistor 56 for precharging (FIG. 5) connected to the wiring LBUS2, and a switch transistor DSW3 connected to the wiring LBUS2 and a wiring DBUS. A charge transistor 60 for precharging is connected to the wiring DBUS.

The wiring LBUS1 and the wiring DBUS are electrically connected to each other via the switch transistor DSW1. Accordingly, when the switch transistor DSW1 is in an ON state, a current path is established between the wiring LBUS1 and the wiring DBUS, and when the switch transistor DSW1 is in an OFF state, the current path between the wiring LBUS1 and the wiring DBUS is cut off.

The wiring LBUS1 and the wiring LBUS2 are electrically connected to each other via the switch transistor DSW2. Accordingly, when the switch transistor DSW2 is in an ON state, a current path is established between the wiring LBUS1 and the wiring LBUS2, and when the switch transistor DSW2 is in an OFF state, the current path between the wiring LBUS1 and the wiring LBUS2 is cut off.

The wiring LBUS2 and the wiring DBUS are electrically connected to each other via the switch transistor DSW3. Accordingly, when the switch transistor DSW3 is in an ON state, a current path is established between the wiring LBUS2 and the wiring DBUS are electrically conducted, and when the switch transistor DSW3 is in an OFF state, the current path between the wiring LBUS2 and the wiring DBUS is cut off.

As shown in FIG. 5, the sense amplifier SA includes a sense transistor 31 that discharges charges of the wiring LBUS1 according to a current flowing through the bit line BL. A source electrode of the sense transistor 31 is connected to a ground voltage supply terminal. A drain electrode of the sense transistor 31 is connected to the wiring LBUS1 via a switch transistor 32. A gate electrode of the sense transistor 31 is connected to the bit line BL via a sense node SEN, a discharge transistor 33, a node COM, a clamp transistor 34, and a breakdown voltage transistor 35. The sense node SEN is connected to a voltage supply line that supplies a voltage $V_{DD}$ via a charge transistor 36 and a charge transistor 37, and is connected to an internal control signal CLK via a capacitor 38. The node COM is connected to the voltage supply line that supplies the voltage $V_{DD}$ via a charge transistor 39 and the charge transistor 37, and is connected to a voltage supply line that supplies a voltage $V_{SRC}$ via a discharge transistor 40.

The sense transistor 31, the switch transistor 32, the discharge transistor 33, the clamp transistor 34, the charge transistor 36, the charge transistor 39, and the discharge transistor 40 are, for example, enhancement-type NMOS transistors. The breakdown voltage transistor 35 is, for example, a depletion-type NMOS transistor. The charge transistor 37 is, for example, a PMOS transistor.

A gate electrode of the switch transistor 32 is connected to the sequencer SQC via a signal line STB. A gate electrode of the discharge transistor 33 is connected to the sequencer SQC via a signal line XXL. A gate electrode of the clamp transistor 34 is connected to the sequencer SQC via a signal line BLC. A gate electrode of the breakdown voltage transistor 35 is connected to the sequencer SQC via a signal line BLS. A gate electrode of the charge transistor 36 is connected to the sequencer SQC via a signal line HLL. A gate electrode of the charge transistor 37 is connected to a node INV of the latch circuit SDL. A gate electrode of the charge transistor 39 is connected to the sequencer SQC via a signal line BLX. A gate electrode of the discharge transistor 40 is connected to the node INV of the latch circuit SDL.

The latch circuit SDL includes a node LAT and the node INV, inverters 41 and 42 connected in parallel to the nodes LAT and INV, a switch transistor 43 connected to the node LAT and the wiring LBUS1, and a switch transistor 44 connected to the node INV and the wiring LBUS1. The switch transistors 43 and 44 are, for example, NMOS transistors. A gate electrode of the switch transistor 43 is connected to the sequencer SQC via a signal line STL. A gate electrode of the switch transistor 44 is connected to the sequencer SQC via a signal line STI. In addition, the node INV of the latch circuit SDL is connected to the gate electrode of the charge transistor 37 and the gate electrode of the discharge transistor 40.

The latch circuits ADL, BDL, CDL and TDL are configured in almost the same manner as the latch circuit SDL except for that the node INV of the latch circuit SDL is connected to the gate electrodes of the charge transistor 37 and the discharge transistor 40 of the sense amplifier SA.

The switch transistor DSW1 is, for example, an enhancement-type NMOS transistor. The switch transistor DSW1 is connected between the wiring LBUS1 and the wiring DBUS. A gate electrode of the switch transistor DSW1 is connected to the sequencer SQC via a signal line DBS1.

The switch transistors DSW2, DSW3 are, for example, enhancement-type NMOS transistors. The switch transistor DSW2 is connected between the wiring LBUS1 and the wiring LBUS2. The switch transistor DSW3 is connected between the wiring LBUS2 and the wiring DBUS. Gate electrodes of the switch transistors DSW2, DSW3 are connected to the sequencer SQC via signal lines DBS2, DBS3, respectively.

As shown in FIG. 4, the signal lines STB, XXL, BLC, BLS, HLL, and BLX are commonly connected across all the sense amplifier units SAU in the sense amplifier module SAM. Further, the voltage supply lines that supply the voltage $V_{DD}$ and the voltage $V_{SRC}$ are commonly connected across all the sense amplifier units SAU in the sense amplifier module SAM.

The signal line STI and the signal line STL of the latch circuit SDL are commonly connected across all the sense amplifier units SAU in the sense amplifier module SAM. Similarly, the signal lines ATI, ATL, BTI, BTL, CTI, CTL, TTI and TTL in the latch circuits ADL, BDL, CDL and TDL corresponding to the signal line STI and the signal line STL are commonly connected across all the sense amplifier units SAU in the sense amplifier module SAM.

In addition, a plurality of the signal lines DBS1 and a plurality of the signal lines DBS3 described above are provided correspondingly to all the sense amplifier units SAU in the sense amplifier module SAM, and are independently connected to all the sense amplifier units SAU. The signal line DBS2 is commonly connected across all the sense amplifier units SAU in the sense amplifier module SAM.

The cache memory CM (FIG. 2) includes a plurality of latch circuits XDL (FIG. 5). The latch circuit XDL is connected to a bidirectional bus YIO (FIG. 2 and FIG. 5). The latch circuit XDL temporarily stores write data transmitted from the input and output control circuit I/O via the bidirectional bus YIO. Further, the latch circuit XDL temporarily stores read data transmitted from the latch circuit ADL connected to the wiring LBUS2 or from the latch circuits BDL, CDL, TDL and SDL connected to the wiring LBUS1 via the wiring DBUS.

The voltage generation circuit VG (FIG. 2) includes, for example, a step-up circuit such as a charge pump circuit, a step-down circuit such as a regulator, and a plurality of voltage supply lines (not shown) which are connected respectively to a power supply terminal and a ground terminal. The step-up circuit and the step-down circuit are respectively connected to power supply voltage supply terminals $V_{CC}$ and $V_{SS}$. The voltage generation circuit VG steps up or steps down a voltage between the power supply voltage supply terminals $V_{CC}$ and $V_{SS}$ according to an internal control signal from the sequencer SQC, generates a plurality of operation voltages supplied to the bit lines BL, the source line SL, the word line WL, and the select gate lines (SGD, SGS) during a read operation, a write operation, and an erase operation for the memory cell array MCA, and simultaneously outputs the operation voltages from the plurality of voltage supply lines.

The sequencer SQC sequentially decodes command data CMD stored in the command register CMR, and outputs an internal control signal to the row decoder RD, the sense amplifier module SAM, and the voltage generation circuit VG. The sequencer SQC appropriately outputs status data indicating its own state to the status register STR. For example, when the write operation or the erase operation is executed, information indicating whether the write operation or the erase operation has normally completed is output as the status data. The sequencer SQC outputs a ready/busy signal RB to the output buffer OB. The ready/busy signal RB is a signal that notifies the controller die CD of whether the sequencer SQC is in a ready state capable of receiving a command from the controller die CD or in a busy state not capable of receiving the command.

The input and output control circuit I/O includes data signal input and output terminals DQ0 to DQ7, toggle signal input and output terminals DQS, /DQS, a plurality of input circuits, a plurality of output circuits, a shift register, and a buffer circuit.

Data input via the data signal input and output terminals DQ0 to DQ7 is transferred from the buffer circuit to the cache memory CM, the address register ADR, or the command register CMR according to an internal control signal from the logical circuit CTR. Data output via the data signal input and output terminal DQ0 to DQ7 is transferred from the cache memory CM or the status register STR to the buffer circuit according to the internal control signal from the logical circuit CTR.

Each of the input circuits includes, for example, a comparator connected to any one of the data signal input and output terminal DQ0 to DQ7 or both of the toggle signal input and output terminals DQS, /DQS. Each of the output circuits includes, for example, an off chip driver (OCD) circuit connected to any one of the data signal input and output terminal DQ0 to DQ7 or any one of the toggle signal input and output terminals DQS, /DQS.

The logical circuit CTR receives an external control signal from the controller die CD via external control terminals/CEn, CLE, ALE, /WE, /RE and RE, and outputs an internal control signal to the input and output control circuit I/O in response to the external control signal. The output buffer OB outputs the ready/busy signal RB output from the sequencer SQC to the controller die CD via an external output terminal RBn. A high "H" state of the external output terminal RBn corresponds to a ready state, and a low "L" state corresponds to a busy state.

Figure 6:
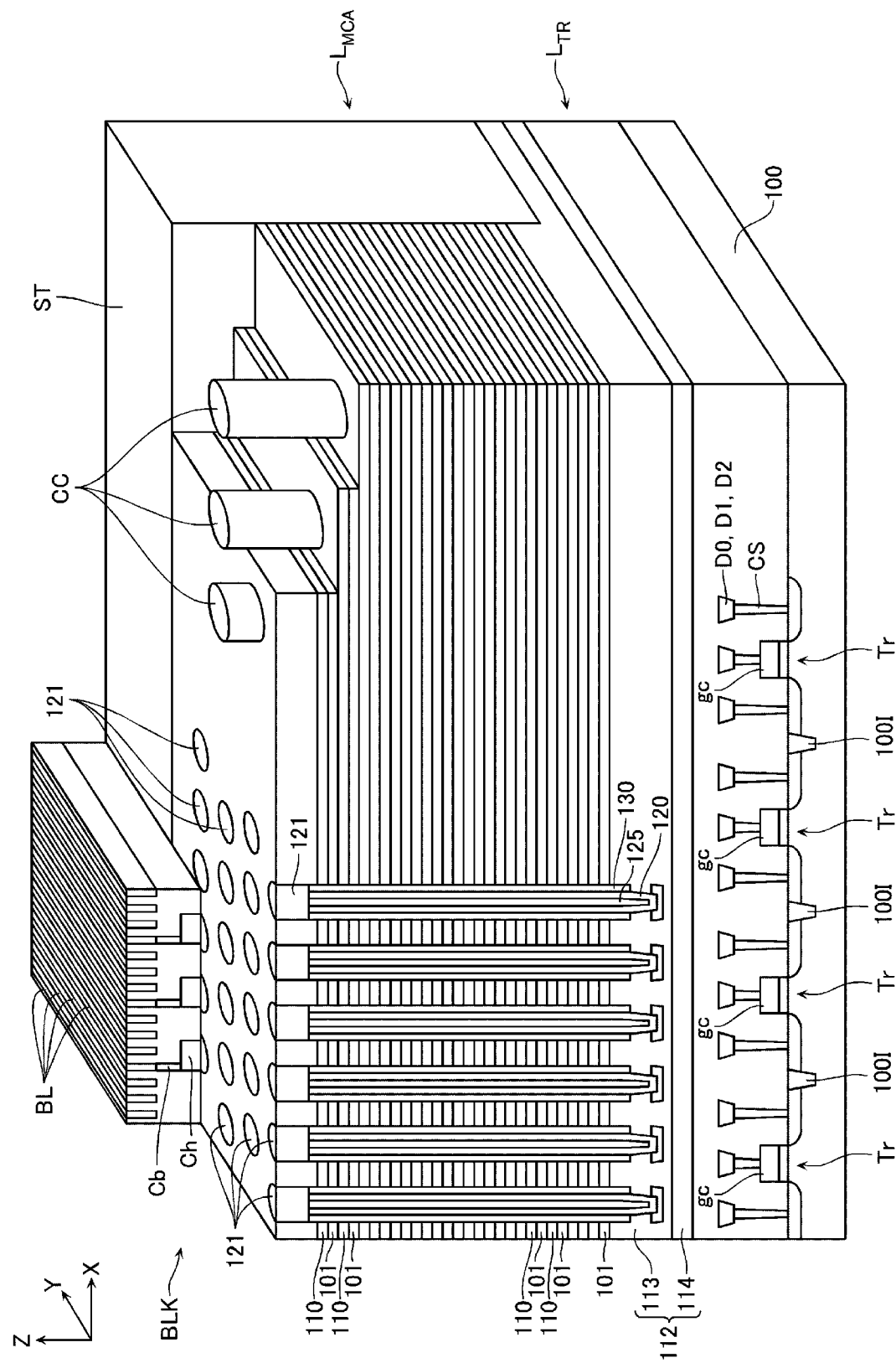
FIG. 6 is a schematic perspective view showing the configuration of the memory die.
Figure 7:
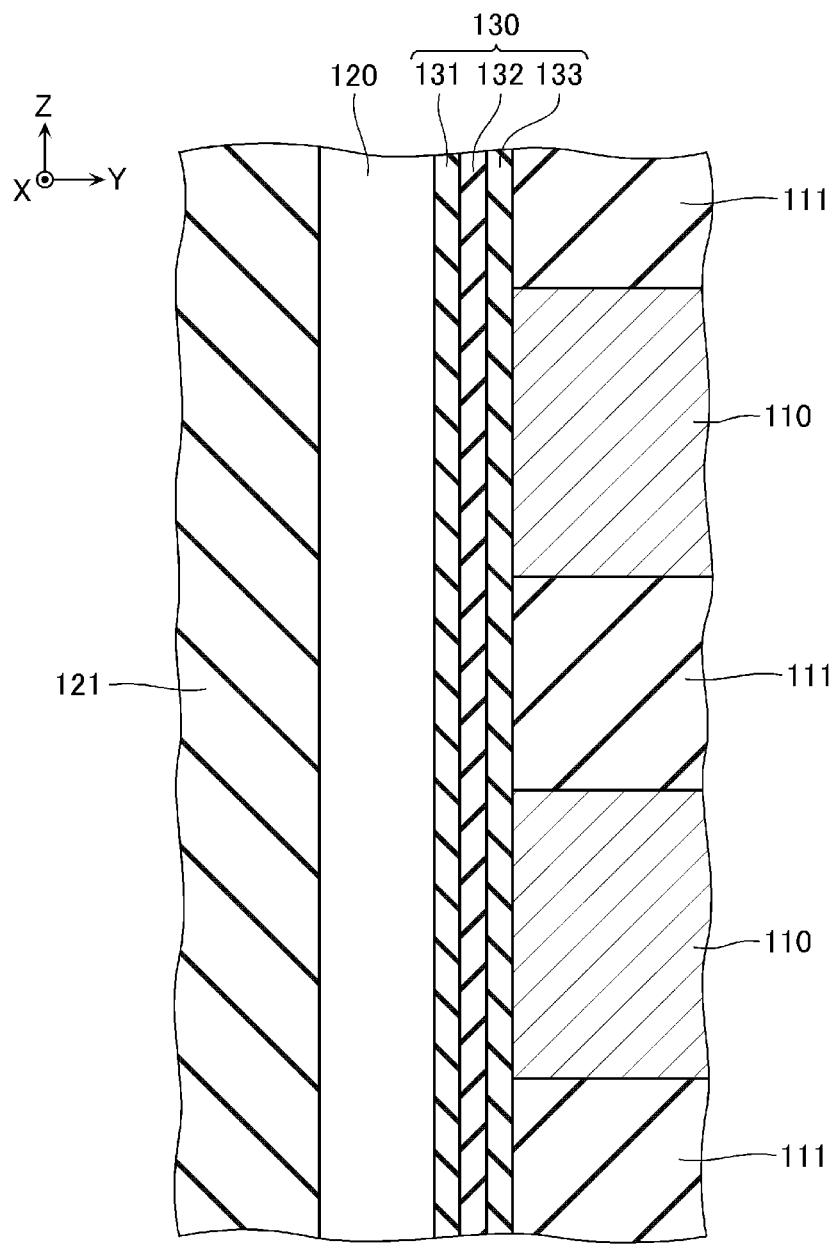
FIG. 7 is a schematic enlarged view showing a part of the configuration in FIG. 6.

Next, a configuration example of the semiconductor storage device according to the present embodiment will be described with reference to FIGS. 6 and 7. FIG. 6 is a schematic perspective view of the semiconductor storage device according to the present embodiment. FIG. 7 is a schematic enlarged view showing a part of the configuration in FIG. 6. FIGS. 6 and 7 show schematic configurations, and specific configurations can be changed appropriately. A part of the configurations is omitted in FIGS. 6 and 7.

As shown in FIG. 6, the memory die MD includes a semiconductor substrate 100, a transistor layer $L_{TR}$ provided on the semiconductor substrate 100, and a memory cell array layer $L_{MCA}$ provided on the transistor layer $L_{TR}$.

The semiconductor substrate 100 is, for example, a semiconductor substrate such as single crystal silicon (Si) containing a P-type impurity. An N-type well containing an N-type impurity such as phosphorus (P) is provided on a part of a surface of the semiconductor substrate 100. A P-type well containing a P-type impurity such as boron (B) is provided on a part of a surface of the N-type well. Further, an insulating region 1001 is provided on a part of the surface of the semiconductor substrate 100.

The transistor layer $L_{TR}$ is provided with a plurality of transistors Tr constituting the peripheral circuit PC. Source regions, drain regions, and channel regions of the transistors Tr are provided on the surface of the semiconductor substrate 100. Gate electrodes gc of the transistors Tr are provided in the transistor layer $L_{TR}$. The source regions, the drain regions, and the gate electrodes gc of the transistors Tr are provided with contacts CS. The contacts CS are connected to other transistors Tr, structures in the memory cell array layer $L_{MCA}$, and the like via wirings D0, D1, and D2 in the transistor layer $L_{TR}$.

The memory cell array layer $L_{MCA}$ includes a plurality of memory blocks BLK and a plurality of inter-block structures ST alternately arranged in a Y direction. The memory block BLK includes a plurality of conductive layers 110 and a plurality of insulating layers 101 alternately arranged in a Z direction, a plurality of semiconductor pillars 120 extending in the Z direction, and a plurality of gate insulating films 130 provided between the conductive layers 110 and the semiconductor pillars 120.

The conductive layer 110 is a substantially plate-shaped conductive layer extending in an X direction and the Y direction, and a plurality of the conductive layers 110 are arranged in the Z direction. The conductive layer 110 may include, for example, a stacked film of titanium nitride (TiN) and tungsten (W), or may include polycrystalline silicon containing an impurity such as phosphorus or boron.

Among the conductive layers 110, one or more conductive layers 110 located in a lowest layer function as the source select gate line SGS (FIG. 3) and gate electrodes of a plurality of the source select transistors STS connected to the source select gate line SGS. Further, a plurality of the conductive layers 110 located above the above conductive layers 110 function as the word lines WL (FIG. 3) and gate electrodes of the memory cells MC (FIG. 3) connected to the word lines WL. One or more conductive layers 110 located above the above conductive layers 110 function as the drain select gate line SGD and gate electrodes of a plurality of the drain select transistors STD (FIG. 3) connected to the drain select gate line SGD.

A conductive layer 112 is provided below the conductive layers 110. The conductive layer 112 includes a semiconductor layer 113 connected to a lower end of the semiconductor pillar 120, and a conductive layer 114 connected to a lower surface of the semiconductor layer 113. The semiconductor layer 113 may contain, for example, polycrystalline silicon containing an impurity such as phosphorus (P) or boron (B). The conductive layer 114 may include, for example, a conductive layer made of a metal such as tungsten (W), or tungsten silicide or the like, or other conductive layers. The insulating layer 101 made of silicon oxide (SiO$_2$) or the like is provided between the conductive layer 112 and the conductive layer 110.

The conductive layer 112 functions as the source line SL (FIG. 3). For example, the source line SL is commonly provided for all the memory blocks BLK in the memory cell array MCA (FIG. 3).

The plurality of semiconductor pillars 120 are arranged in the X direction and the Y direction. Each of the semiconductor pillars 120 is, for example, a semiconductor film such as undoped polycrystalline silicon (Si). The semiconductor pillar 120 has, for example, a substantially cylindrical shape, and an insulating film 125, such as silicon oxide, is provided at a center part. An outer peripheral surface of the semiconductor pillar 120 is surrounded by the conductive layer 110. A lower end portion of the semiconductor pillar 120 is connected to the semiconductor layer 113 of the conductive layer 112. An upper end portion of the semiconductor pillar 120 is connected to the bit line BL via an impurity region 121 including an N-type impurity such as phosphorus (P), and via contacts Ch, Cb. The semiconductor pillar 120 functions as a channel region of the plurality of memory cells MC and the select transistors STD, STS in one memory string MS (FIG. 3).

For example, as shown in FIG. 7, the gate insulating film 130 includes a tunnel insulating film 131, a charge storage film 132, and a block insulating film 133 stacked between the semiconductor pillar 120 and the conductive layer 110. The tunnel insulating film 131 and the block insulating film 133 are, for example, insulating films such as silicon oxide. The charge storage film 132 is a film capable of storing charges such as silicon nitride (SiN). The tunnel insulating film 131, the charge storage film 132, and the block insulating film 133 have a substantially cylindrical shape and extend in the Z direction along the outer peripheral surface of the semiconductor pillar 120.

FIG. 7 shows an example in which the gate insulating film 130 includes the charge storage film 132 such as silicon nitride. Alternatively, the gate insulating film 130 may include a floating gate such as polycrystalline silicon containing an N-type or a P-type impurity.

As shown in FIG. 6, the inter-block structure ST extends in the X direction and the Z direction. The inter-block structure ST may include an insulating layer such as silicon oxide (SiO$_2$). Alternatively, the inter-block structure ST may include a conductive layer extending in the X direction and the Z direction and connected to the conductive layer 112, and an insulating layer such as silicon oxide (SiO$_2$) provided on both sides of this conductive layer in the Y direction.

[Threshold Voltage of Memory Cell MC]

Figure 8:
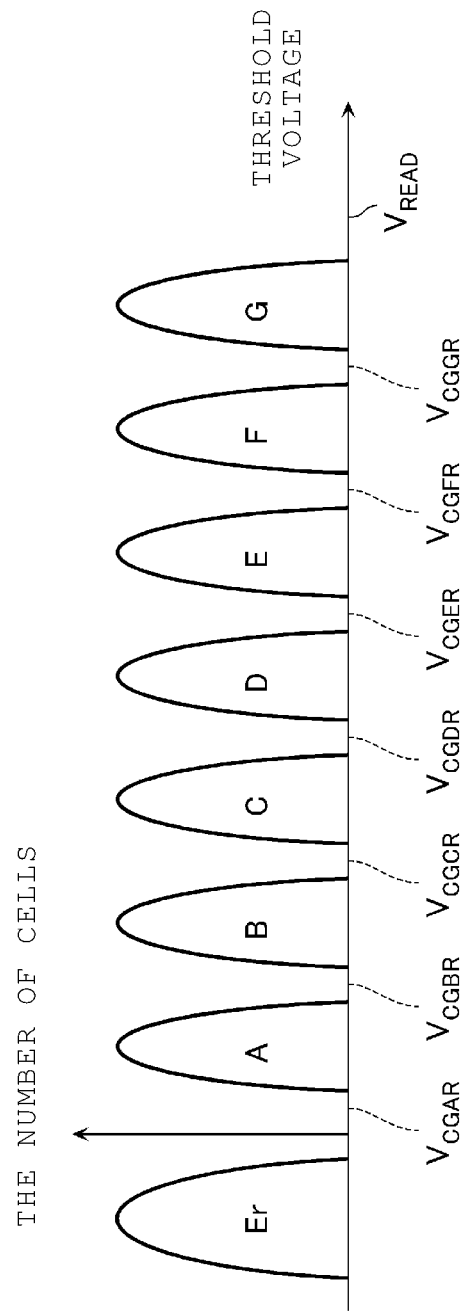
FIGS. 8A and 8B are schematic diagrams of data recorded in memory cells.

Next, the threshold voltages of the memory cells MC will be described with reference to FIGS. 8A and 8B. FIG. 8A is a schematic histogram showing the threshold voltages of the memory cells MC. A horizontal axis indicates a voltage of the word line WL, and a vertical axis indicates the number of memory cells MC. FIG. 8B shows an example of the threshold voltages of the memory cells MC and data recorded in the memory cells MC.

As described above, the memory cell array MCA includes a plurality of the memory cells MC. When a write operation is performed on the memory cells MC, the threshold voltages of the memory cells MC are controlled to a plurality of states. FIG. 8A shows a threshold voltage distribution of the memory cells MC controlled to eight states. For example, a threshold voltage of the memory cell MC controlled to the A state is larger than a read voltage $V_{CGAR}$ in FIG. 8A and is smaller than a read voltage $V_{CGBR}$. In addition, the threshold voltages of all the memory cells MC are smaller than a read pass voltage $V_{READ}$ in FIG. 8A.

In the present embodiment, 3-bit data is recorded in each of the memory cells MC by adjusting the memory cells MC to the eight states.

For example, the Er state corresponds to a lowest threshold voltage (and corresponds to the threshold voltage of the memory cell MC in an erased state). For example, data "111" is assignment to the memory cells MC corresponding to the Er state.

The A state corresponds to a threshold voltage higher than the threshold voltage corresponding to the Er state. For example, data "110" is assigned to the memory cell MC corresponding to the A state.

Further, the B state corresponds to a threshold voltage higher than the threshold voltage corresponding to the A state. For example, data "100" is assigned to the memory cell MC corresponding to the B state.

Similarly, in FIG. 8A, the C state to the G state correspond to threshold voltages higher than threshold voltages corresponding to the B state to the F state. For example, data "000", "010", "011", "001", and "101" are assigned to the memory cells MC corresponding to these distributions.

In a case of the data assignment as shown in FIG. 8B, data of a lower bit can be determined by two read voltages $V_{CGAR}$, $V_{CGER}$, data of a middle bit can be determined by three read voltages $V_{CGBR}$, $V_{GGDR}$, and $V_{CGFR}$, and data of an upper bit can be determined by two read voltages $V_{CGCR}$, $V_{CGGR}$. Such data assignment may be referred to as a 2-3-2 code.

The number of bits of data to be recorded in the memory cells MC, the number of states, and the assignment of data to each state can be changed appropriately.

[Read Operation]

Next, the read operation of the semiconductor storage device according to the present embodiment will be described.

Figure 9:
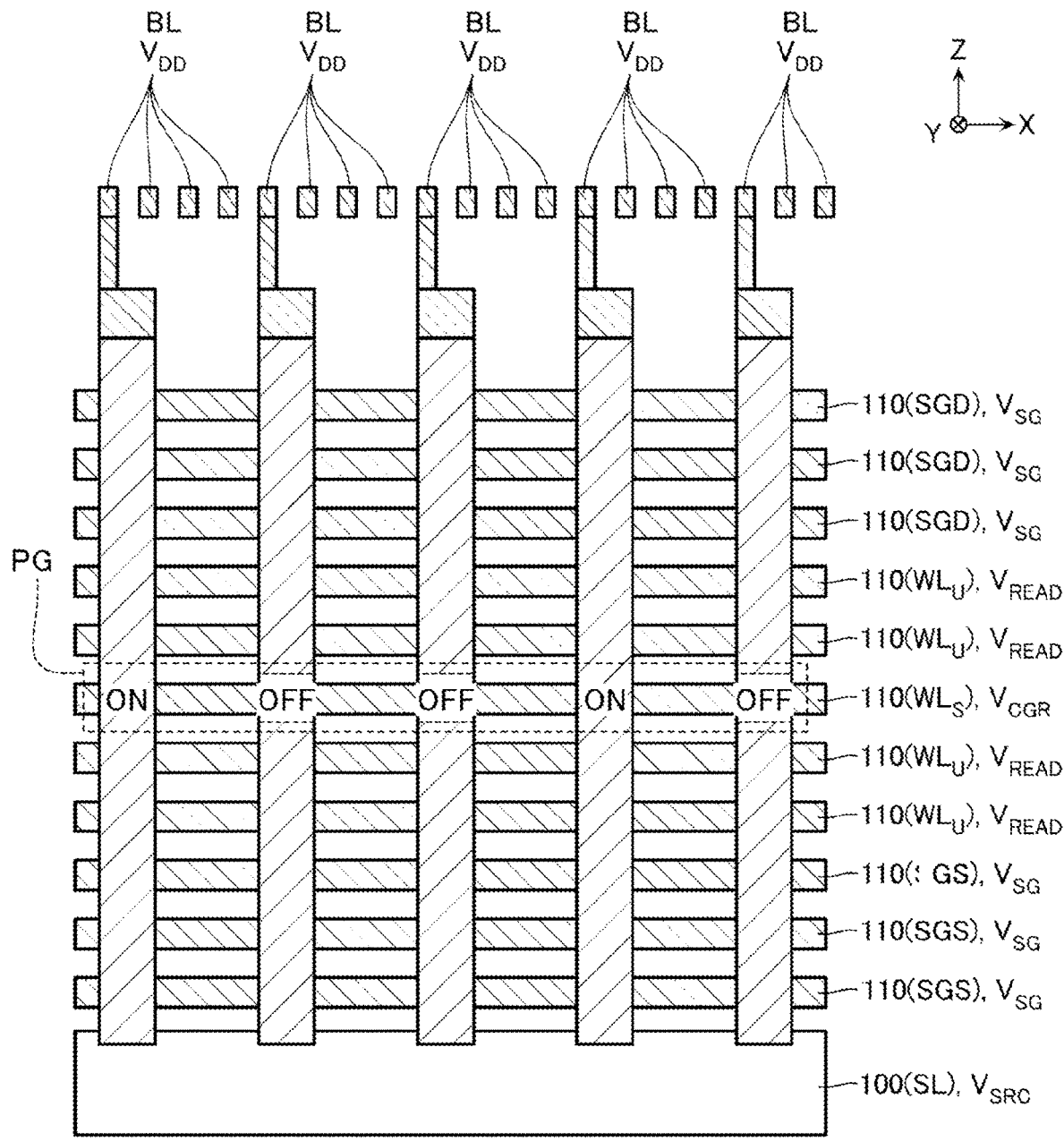
FIG. 9 is a schematic cross-sectional view showing a read operation.

FIG. 9 is a schematic cross-sectional view showing the read operation. In the following description, an example in which each memory cell MC stores multiple-bit data and a plurality of read voltages are used in the read operation will be described.

In the following description, the word line WL that is a target of the operation may be called a selected word line $WL_s$, and the remaining word lines WL may be referred to as non-selected word lines $WL_U$. In the following description, an example of executing the read operation for the memory cell connected to the selected word line $WL_s$ (hereinafter, may also be referred to as "selected memory cell MC") among the memory cells MC in the string unit that is a target of the operation will be described. In the following description, such a structure including a plurality of selected memory cells MC may be referred to as a selected page PG.

During the read operation, for example, the voltage $V_{DD}$ is supplied to the bit lines BL. For example, an "H" (where "H" is shorthand for high level or high state and "L" is shorthand for low level or low state) is latched to the latch circuit SDL in FIG. 5, and states of the signal lines STB, XXL, BLC, BLS, HLL, and BLX are set to "L, L, H, H, H, and H". Accordingly, the voltage $V_{DD}$ is supplied to the bit lines BL and the sense node SEN. Further, the voltage $V_{SRC}$ is supplied to the source line SL. The voltage $V_{SRC}$ may be larger than or equal to a ground voltage $V_{SS}$. The voltage $V_{DD}$ is larger than the voltage $V_{SRC}$.

During the read operation, a voltage $V_{SG}$ is supplied to the drain select gate line SGD. The voltage $V_{SG}$ is larger than the voltage $V_{DD}$. Further, a voltage difference between the voltage $V_{SG}$ and the voltage $V_{DD}$ is larger than a threshold voltage of the drain select transistor STD when the drain select transistor STD is an NMOS transistor. Therefore, a channel of electrons is formed in the channel region of the drain select transistor STD, and the voltage $V_{DD}$ is transferred through the drain select transistor STD.

During the read operation, the voltage $V_{SG}$ is supplied to the source select gate line SGS. The voltage $V_{SC}$ is larger than the voltage $V_{SRC}$. Further, a voltage difference between the voltage $V_{SC}$ and the voltage $V_{SRC}$ is larger than a threshold voltage of the source select transistor STS when the source select transistor STS is an NMOS transistor. Therefore, a channel of electrons is formed in a channel region of the source select transistor STS, and the voltage $V_{SRC}$ is transferred through the source select transistor STS.

During the read operation, the read pass voltage $V_{READ}$ is supplied to the non-selected word lines $WL_U$. The read pass voltage $V_{READ}$ is larger than the voltages $V_{DD}$ and $V_{SRC}$. When the memory cells MC are NMOS transistors, the read pass voltage $V_{READ}$ is set to be larger than the threshold voltages of the memory cells MC to turn on the memory cells MC regardless of data recorded therein. Therefore, a channel of electrons is formed in the channel regions of the non-selected memory cells MC, and the voltages $V_{DD}$, $V_{SRC}$ are transferred through the non-selected memory cells MC.

Further, during the read operation, a read voltage $V_{CGR}$ is supplied to the selected word line $WL_s$. The read voltage $V_{CGR}$ is smaller than the read pass voltage $V_{READ}$. The read voltage $V_{CGR}$ is any one of the read voltages $V_{CGAR}$ to $V_{CGGR}$ described with reference to FIG. 8A. A voltage difference between the read voltage $V_{CGR}$ and the voltage $V_{SRC}$ is larger than the threshold voltage of some of the memory cells MC. Accordingly, these memory cells MC are in the ON state. Therefore, a current flows through the bit lines BL connected to these memory cells MC. On the other hand, the voltage difference between the read voltage $V_{CGR}$ and the voltage $V_{SRC}$ is smaller than the threshold voltage of the other memory cells MC. Accordingly, these other memory cells MC are in the OFF state. Therefore, no current flows through the bit lines BL connected to these other memory cells MC.

In addition, during the read operation, the sense amplifier SA (FIG. 5) detects whether the current flows through the bit line BL so as to detect the ON state/OFF state of the memory cells MC. Hereinafter, such an operation is referred to as a "sense operation". During the sense operation, for example, in a state where the voltage $V_{DD}$ is supplied to the bit lines BL (FIG. 3), the states of the signal lines STB, XXL, BLC, BLS, HLL, and BLX are set to "L, H, H, H, L and L". Accordingly, a current path is established between the sense node SEN of the sense amplifier SA (FIG. 5) and the bit lines BL. After a certain period of time is elapsed, the states of the signal lines STB, XXL, BLC, BLS, HLL, and BLX are set to "L, L, H, H, L, L". Accordingly, the current path between the sense node SEN of the sense amplifier SA (FIG. 5) and the bit line BL is cut off. After the sense operation is executed, a current path is established between the sense transistor 31 and the wiring LBUS1 (FIG. 5), and the charges of the wiring LBUS1 are discharged through the sense transistor 31 or maintained. Further, a current path is established between one of the latch circuits in the sense amplifier unit SAU and the wiring LBUS1, and the data of the wiring LBUS1 is latched by this latch circuit.

During the read operation, arithmetic processing such as AND and OR is executed on the data indicating the states of the memory cells MC as necessary, and thus the data recorded in the memory cells MC is calculated. In addition, the data is transferred to the latch circuit XDL (FIG. 5) in the cache memory CM (FIG. 2) via the wiring LBUS1 (FIG. 5), the switch transistor DSW1 or the switch transistors DSW2, DSW3, the wiring LBUS2, and the wiring DBUS.

[Cache Read]

The semiconductor storage device according to the present embodiment is capable of executing cache read in addition to the normal read operation. The cache read is basically executed in the same manner as the normal read operation. As will be described later with reference to FIG. 11, during the execution of the normal read operation, the external output terminal RBn is in the "L" state. On the other hand, during the execution of the cache read, the external output terminal RBn is basically in the "H" state.

[Hard Bit Read and Soft Bit Read]

Figure 10:
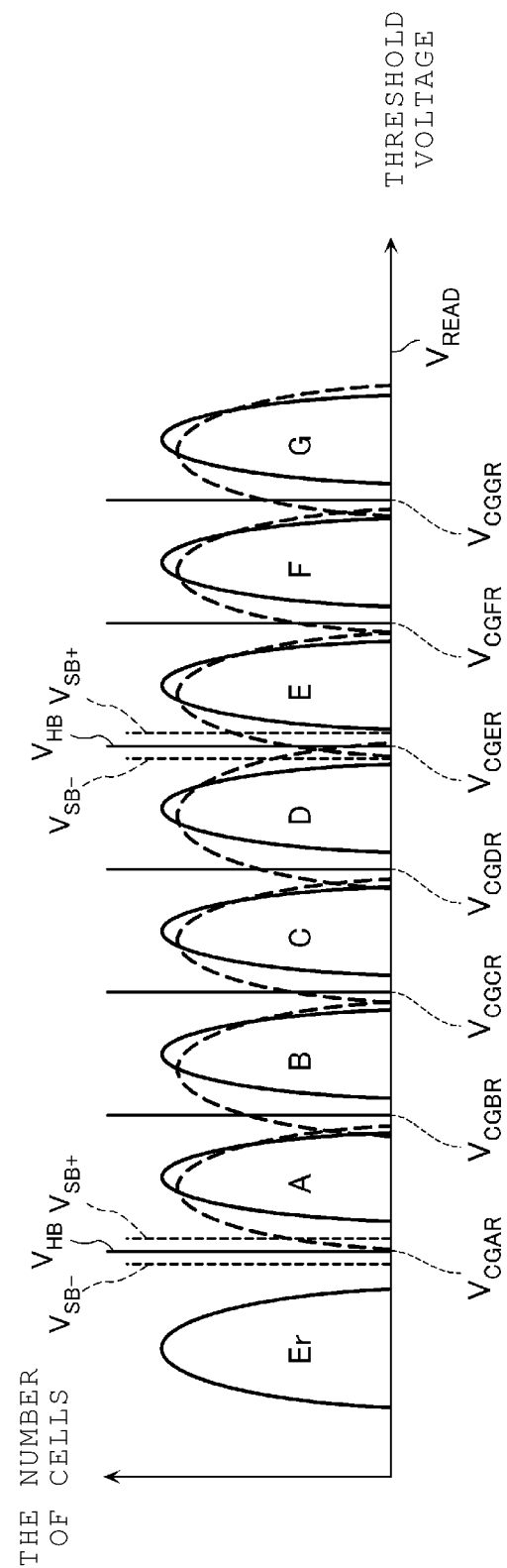
FIG. 10 is a schematic diagram showing hard bit read and soft bit read.

FIG. 10 is a schematic diagram showing the hard bit read and the soft bit read. As described with reference to FIG. 8, during the read operation, the ON state/OFF state of the memory cells MC is detected by supplying the read voltage $V_{CGR}$ (any one of the read voltages $V_{CGAR}$ to $V_{CGGR}$) to the selected word line $WL_s$. The read voltage $V_{CGR}$ is set at a boundary that divides the threshold voltage distribution of the memory cells MC.

However, the threshold voltage distribution of the memory cells MC may be overlapping. As shown in FIG. 10, an actual threshold voltage distribution (distribution shown by a dotted line in FIG. 10) may deviate from an ideal threshold voltage distribution (distribution shown by a solid line in FIG. 10). Further, a width of the actual threshold voltage distribution may be larger than a width of the ideal threshold voltage distribution, and so the actual threshold voltage distribution may overlap with an adjacent threshold voltage distribution. In this case, in a part of the memory cells MC, data different from the written data may be read out.

Therefore, during the read operation, the hard bit read and the soft bit read are performed in order to improve the accuracy of error correction. Data read by the hard bit read may be referred to as "read data HB". For example, the "read data HB" is obtained by obtaining an applied voltage level of the word line WL at a standard level. Further, data read by the soft bit read may be referred to as "read data SB". For example, the "read data SB" is data for verifying the accuracy of the read data, which is obtained by changing the applied voltage level of the word line WL or the like.

During the hard bit read, the read operation is performed using one type of read voltage set at the boundary that divides two threshold voltage distributions, and whether the threshold voltage of the memory cells MC is higher than the read voltage is determined. That is, the hard bit read is the same as the normal read operation (normal read).

During the soft bit read, the read operation is performed under a different condition from the hard bit read. The controller die CD extracts a bit that may have an error based on the read data of the hard bit read and the soft bit read, and corrects the error.

In the present embodiment, the hard bit read applies a certain read voltage (voltage indicated by "$V_{HB}$" in FIG. 10) to the selected word line $WL_s$ and performs the sense operation for a predetermined time. Further, the soft bit read applies the same read voltage ("$V_{HB}$") as in the case of the hard bit read to the selected word line $WL_s$ and performs the sense operation for a different period of time. More specifically, during the soft bit read, time for the sense operation (sense time) is changed while maintaining the read voltage ("$V_{HB}$") applied to the selected word line $WL_s$ in the hard bit read executed immediately before.

Since a discharge amount from the sense node SEN (FIG. 5) increases during the sense operation by lengthening the sense time, it is easy to determine that the memory cells MC are turned on. This case is equivalent to increasing the voltage applied to the selected word line $WL_s$. Further, since the discharge amount from the sense node SEN (FIG. 5) decreases during the sense operation by shortening the sense time, it is easy to determine that the memory cells MC are turned off. This case is equivalent to decreasing the voltage applied to the selected word line $WL_s$. That is, by adjusting the sense operation, it is possible to achieve an effect as if the read voltage applied to the selected word line $WL_s$ has changed in a pseudo manner.

That is, the soft bit read according to the present embodiment obtains the same result as a case where the read operation is performed using a pseudo-different read voltage without directly changing the read voltage of the hard bit read. Specifically, by shortening the sense time of the sense amplifier SA, the same result as a case where the read operation is performed using a read voltage (voltage indicated by "$V_{SB-}$" in FIG. 10) lower than a standard read voltage is obtained. Further, by lengthening the sense time of the sense amplifier SA, the same result as a case where the read operation is performed using a read voltage (voltage indicated by "$V_{SB}+$" in FIG. 10) higher than the standard read voltage is obtained.

During the soft bit read, a read voltage different from the read voltage of the hard bit read may be applied to the selected word line $WL_s$. In this case, the sense time of the hard bit read and the soft bit read may be the same. Alternatively, during the hard bit read and the soft bit read, both the read voltage and the sense time may be different from each other.

[Operations of Sense Amplifier Module SAM]

Next, operations of the sense amplifier module SAM will be described with reference to FIGS. 11 to 24.

Figure 11:
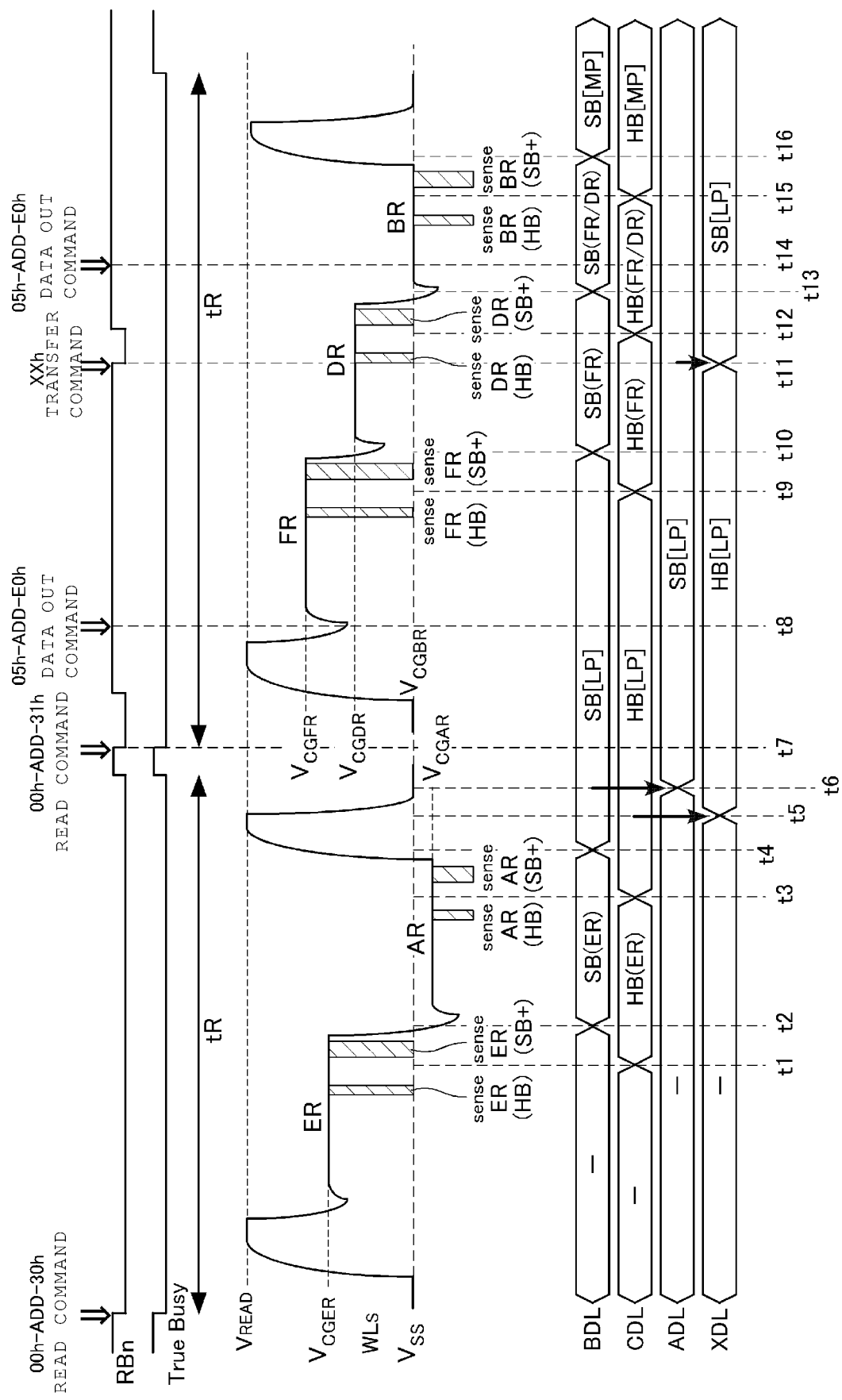
FIG. 11 is a diagram showing timings of operations of the sense amplifier module.

FIG. 11 is a diagram showing timings of the operations of the sense amplifier module SAM. FIGS. 12 to 24 are schematic block diagrams showing data exchanges among the latch circuits.

As shown in FIG. 11, during the read operation according to the present embodiment, two sense operations corresponding to the hard bit read (voltage $V_{HB}$ in FIG. 10) and the soft bit read on a positive side (voltage $V_{SB}+$ in FIG. 10) are executed in accordance with the states of the memory cells MC. In addition, the sense amplifier SA is connected to the wiring LBUS1 as described with reference to FIGS. 4 and 5. It is noted that in FIGS. 12 to 24, the sense amplifier SA is omitted. In the following description, an example in which data is assigned according to the 2-3-2 code in FIG. 8B will be described.

Further, in the following description, eight-bit data to be input to the eight data signal input and output terminals DQ0 to DQ7 may be represented using a two-digit hexadecimal number. For example, when "0, 0, 0, 0, 0, 0, 0, 0" is input to the eight data signal input and output terminals DQ0 to DQ7, the data may be represented as data 00*h* or the like. Further, when "1, 1, 1, 1, 1, 1, 1, 1" is input, the data may be represented as data FF*h* or the like.

When the read operation is started, the controller die CD outputs a command set (hereinafter, may also be referred to as a read command for read operation) instructing a read operation to the memory die MD via the data signal input and output terminals DQ0 to DQ7. As shown in FIG. 11, the read command for read operation includes data 00*h*, ADD, and 30*h*.

The data 00*h* is the command data CMD to be input to the command register CMR. The data 00*h* is input at the start of the read operation. The data ADD is data to be input to the address register ADR. The data ADD includes a column address CA and the row address RA. The data ADD may include, for example, the eight-bit data for 5 to 6 cycles. The data 30h is the command data CMD to be input to command register CMR. The data 30h indicates that the input of the command set for read operation is complete.

In response to the input of the read command for read operation, the sequencer SQC controls the external output terminal RBn from the "H" state to the "L" state. Accordingly, an access to the memory die MD is prohibited. Further, the read operation is executed on the memory die MD.

The word "True Busy" in FIG. 11 indicates a state in which an access to the sense amplifier module SAM is prohibited, or the write operation, the read operation, the erase operation, or the like is being executed for the memory cell array MCA. When the read operation is started in the sense amplifier module SAM, the state indicated by the "True Busy" changes from the "H" state to the "L" state. The word "tR" in FIG. 11 means a period of time during which the read operation is executed.

As shown in FIG. 11, during the read operation, the sequencer SQC supplies the read pass voltage $V_{READ}$ to the selected word line $WL_s$.

Thereafter, the sequencer SQC supplies the read voltage $V_{CGER}$ to the selected word line $WL_s$. Accordingly, the memory cells MC corresponding to the Er state to the D state in FIG. 8A are in the ON state, and the memory cells MC corresponding to the E state to the G state are in the OFF state. In addition, the sequencer SQC charges the bit lines BL. The sequencer SQC charges the wiring LBUS1 by controlling the charge transistor 55 for precharging (FIG. 5). At this time, the switch transistors DSW1, DSW2, and DSW3 are all in the OFF state.

The sequencer SQC executes a sense operation ("sense ER (HB)" in FIG. 11) corresponding to the hard bit read. Here, as described above, the read voltage $V_{CGER}$ (voltage $V_{HB}$ in FIG. 10) of the hard bit read is the same as the read voltage $V_{CGER}$ (FIG. 8) of the normal read operation. Therefore, in the sense operation corresponding to hard bit read, the read voltage $V_{CGER}$ supplied to the selected word line $WL_s$ and the sense time are set to the same as the read voltage $V_{CGER}$ and the sense time during the normal read operation. By executing the sense operation corresponding to the hard bit read, the sense amplifier SA obtains read data (read data HB (ER)) corresponding to the read voltage $V_{CGER}$.

Figure 12:
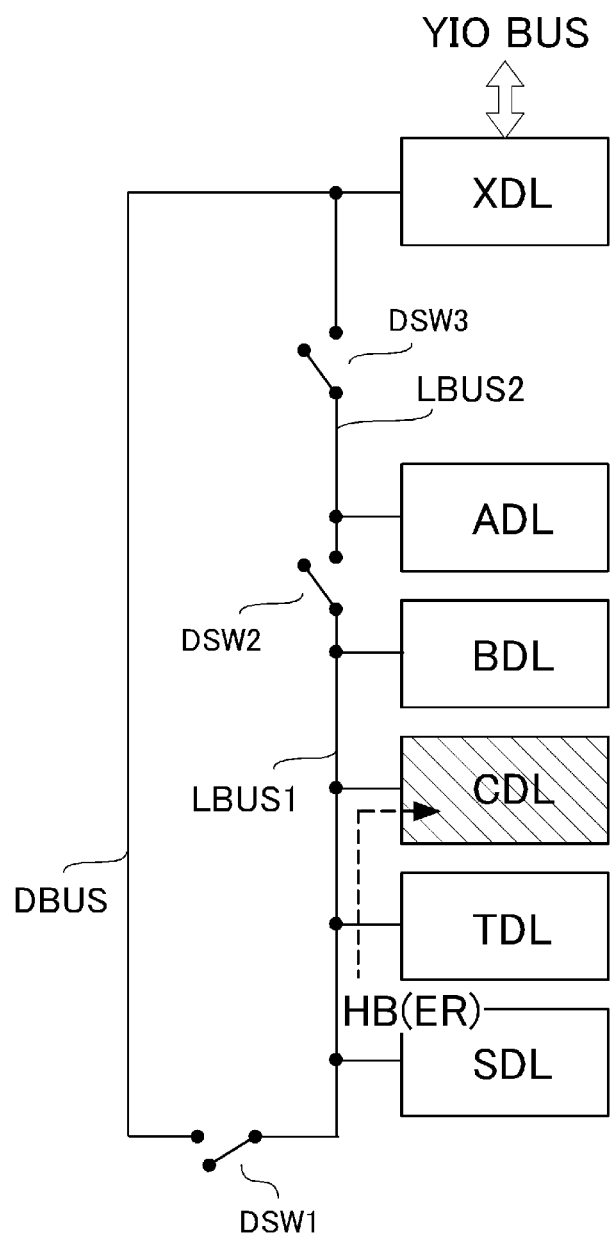
FIGS. 12-24 are schematic block diagrams showing data exchanges among a plurality of latch circuits.

FIG. 12 shows a flow of the read data HB (ER) at a timing t1 of FIG. 11. As shown in FIG. 12, the read data HB (ER) obtained by the sense operation is transferred to the latch circuit CDL via the wiring LBUS1. The latch circuit CDL stores the read data HB (ER).

The sequencer SQC executes a sense operation ("sense ER (SB+)" in FIG. 11) corresponding to the soft bit read. During the soft bit read, a voltage different from the read voltage $V_{CGER}$ (voltage $V_{HB}$ in FIG. 10) of the hard bit read is applied in a pseudo or direct manner. In an example of FIG. 11, the voltage $V_{HB}$ is supplied to the selected word line $WL_s$, and the sense time during the soft bit read is longer than the sense time during the hard bit read. Accordingly, it is possible to lengthen a discharge time of the sense node SEN (FIG. 5) and achieve substantially the same effect as supplying the voltage $V_{SB}+$ to the selected word line $WL_s$. By executing the sense operation corresponding to the soft bit read, the sense amplifier SA obtains read data (read data SB (ER)) corresponding to the read voltage $V_{CGER}$.

Figure 13:
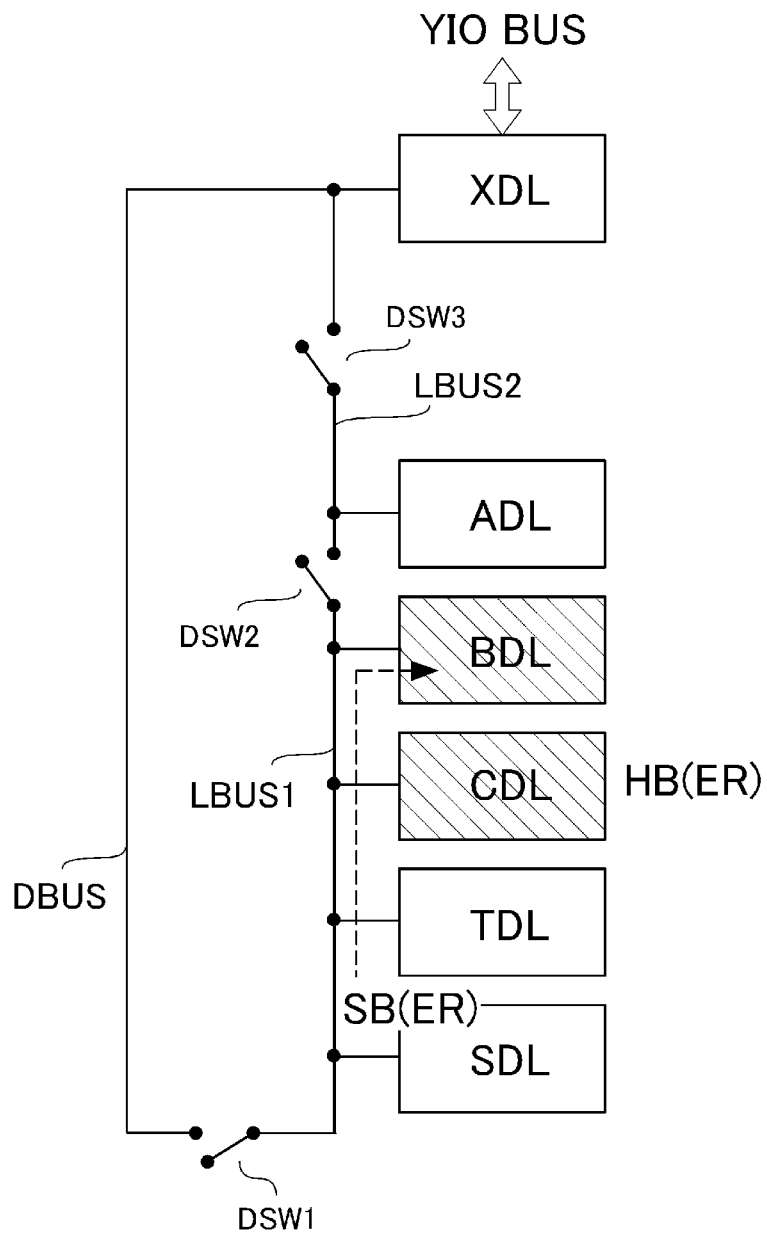

FIG. 13 shows a flow of the read data SB (ER) at a timing t2 of FIG. 11. As shown in FIG. 13, the read data SB (ER) obtained by the sense operation is transferred to the latch circuit BDL via the wiring LBUS1. The latch circuit BDL stores the read data SB (ER).

Next, the sequencer SQC supplies the read voltage $V_{CGAR}$ to the selected word line $WL_s$. Accordingly, the memory cell MC corresponding to the Er state in FIG. 8A is in the ON state, and the memory cells MC corresponding to the A state to the G state are in the OFF state.

The sequencer SQC executes a sense operation ("sense AR (HB)" in FIG. 11) corresponding to the hard bit read. Accordingly, the sense amplifier SA obtains read data (read data HB (AR)) corresponding to the read voltage $V_{CGAR}$.

Figure 14:
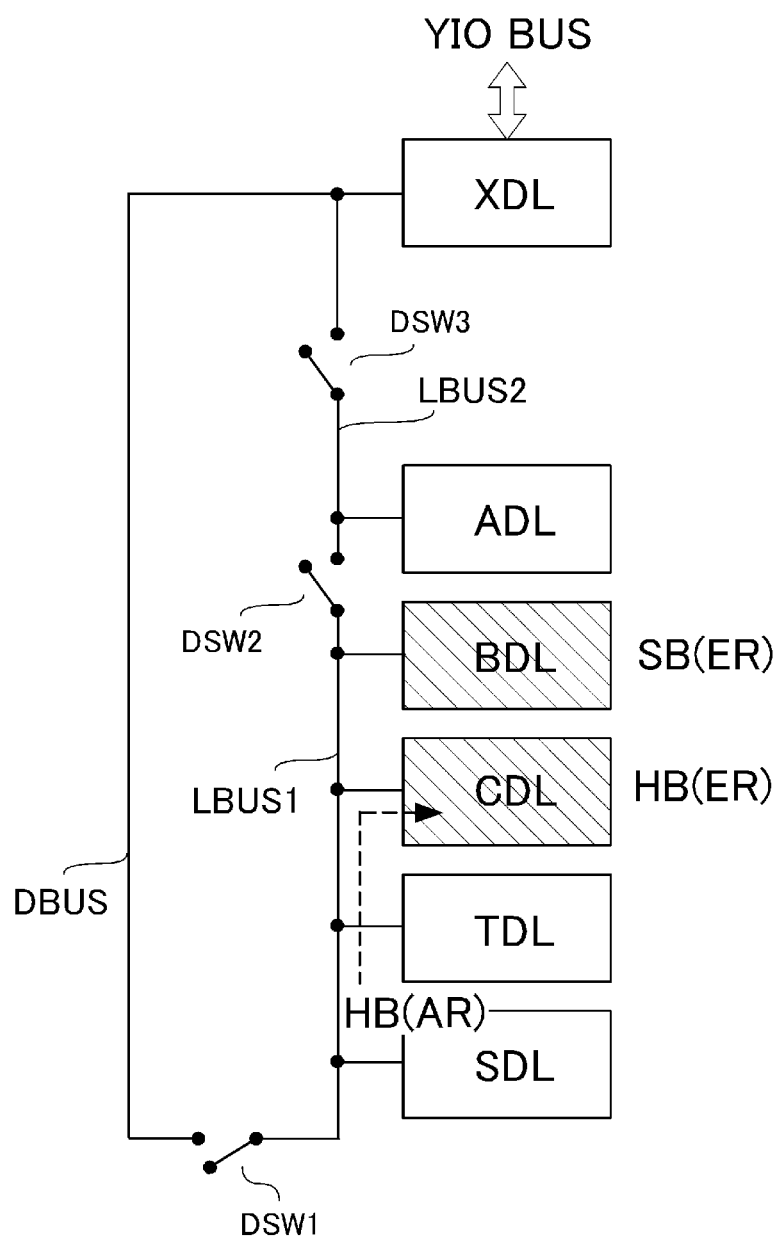

FIG. 14 shows a flow of the read data HB (AR) at a timing t3 of FIG. 11. As shown in FIG. 14, the read data HB (AR) obtained by the sense operation is transferred to the latch circuit CDL. At this time, the read data HB (ER) is stored in the latch circuit CDL. The sense amplifier SA performs a predetermined logical operation on the read data HB (ER) and the read data HB (AR). The latch circuit CDL stores a result HB (ER/AR) of this logical operation. The result HB (ER/AR) of this logical operation is read data HB[LP] of the lower bit (lower page).

Further, the sequencer SQC executes a sense operation ("sense AR (SB+)" in FIG. 11) corresponding to the soft bit read. Accordingly, the sense amplifier SA obtains read data (read data SB (AR)) corresponding to the read voltage $V_{CGAR}$.

Figure 15:
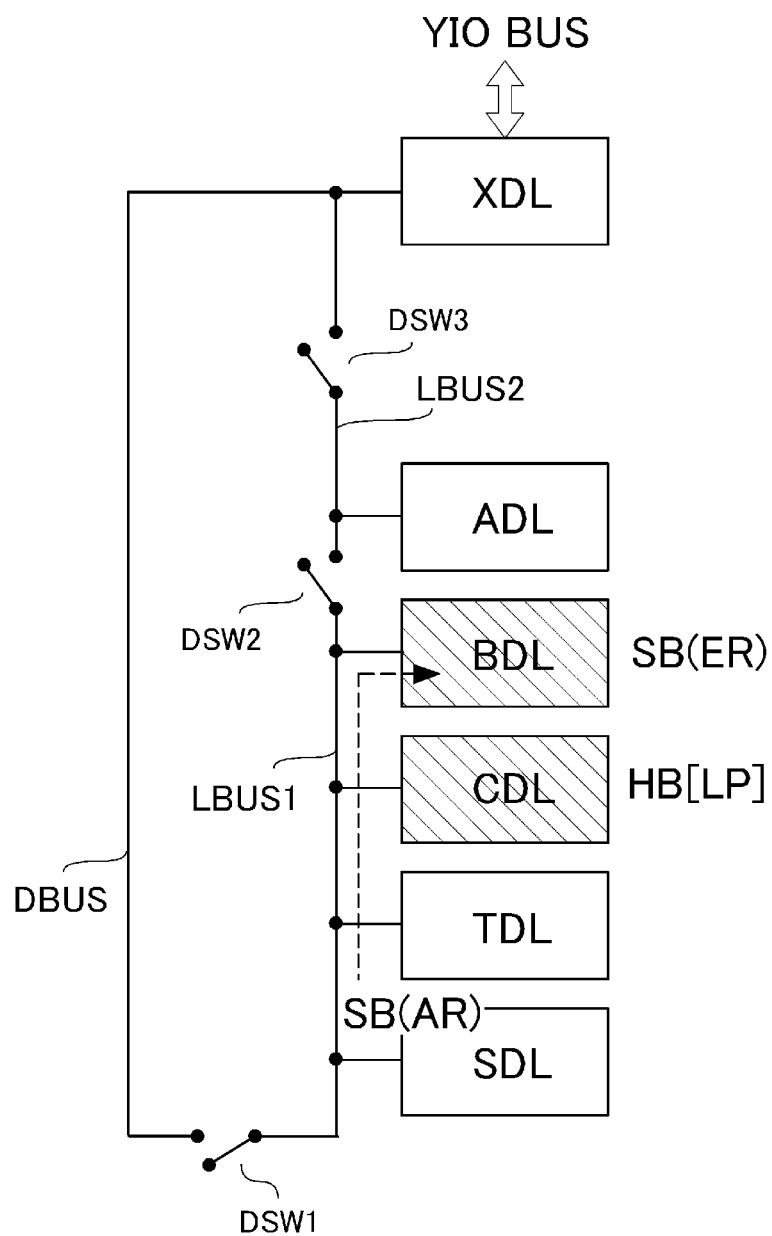

FIG. 15 shows a flow of the read data SB (AR) at a timing t4 of FIG. 11. As shown in FIG. 15, the read data SB (AR) obtained by the sense operation is transferred to the latch circuit BDL. At this time, the read data SB (ER) is stored in the latch circuit BDL. The sense amplifier SA performs the predetermined logical operation on the read data SB (ER) and the read data SB (AR). The latch circuit BDL stores a result SB (ER/AR) of this logical operation. The result SB (ER/AR) of this logical operation is read data SB[LP] of the lower bit (lower page).

Thereafter, the sequencer SQC supplies the read pass voltage $V_{READ}$ to the selected word line $WL_s$.

Figure 16:
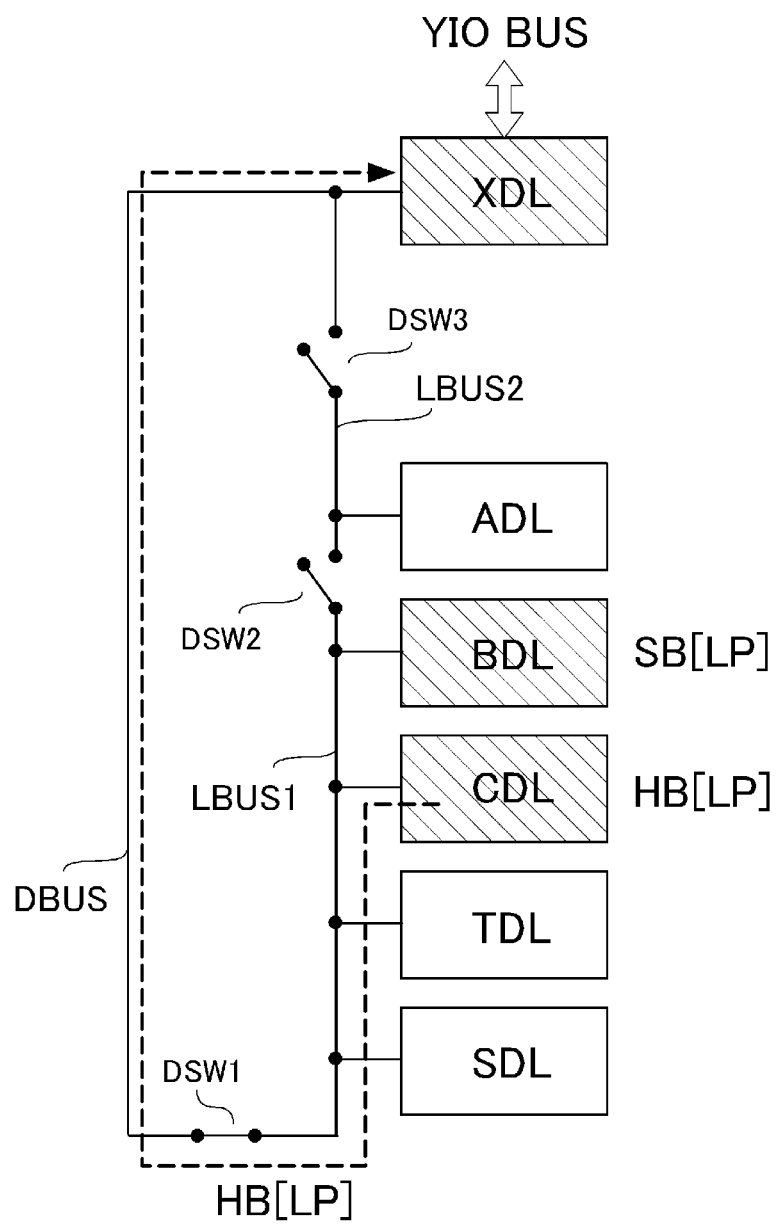

FIG. 16 shows a flow of the read data HB[LP] at a timing t5 of FIG. 11. Before the timing t5, the sequencer SQC charges the wiring DBUS by controlling the charge transistor 60 for precharging (FIG. 5). In addition, the sequencer SQC controls the switch transistor DSW1 to the ON state and controls the switch transistors DSW2 and DSW3 to the OFF state. As shown in FIG. 16, the read data HB[LP] is transferred to the latch circuit XDL from the latch circuit CDL via the wirings LBUS1, DBUS. The latch circuit XDL stores the read data HB[LP].

Figure 17:
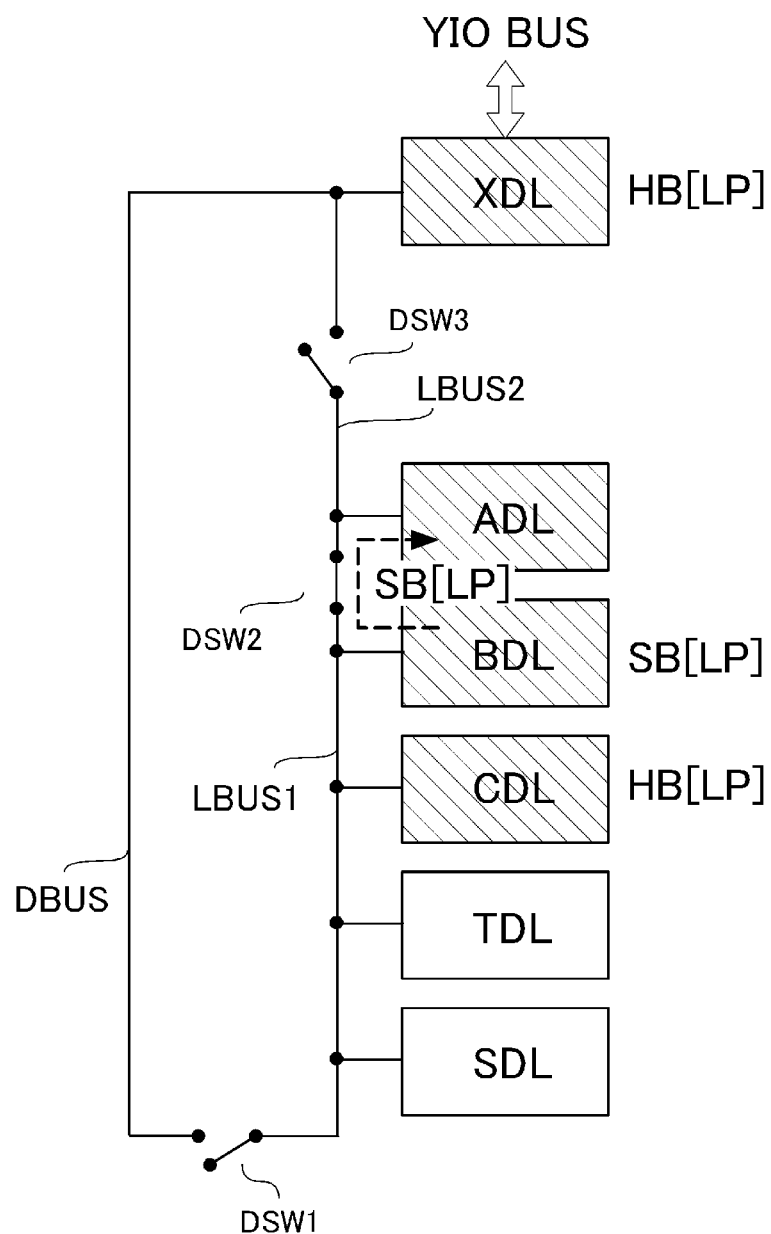

FIG. 17 shows a flow of the read data SB[LP] at a timing t6 of FIG. 11. Before the timing t6, the sequencer SQC charges the wiring LBUS2 by controlling the charge transistor 56 for precharging (FIG. 5). In addition, the sequencer SQC controls the switch transistor DSW1 to the OFF state, controls the switch transistor DSW2 to the ON state, and controls the switch transistor DSW3 to the OFF state. As shown in FIG. 17, the read data SB[LP] is transferred to the latch circuit ADL from the latch circuit BDL via the wirings LBUS1, LBUS2. The latch circuit XDL stores the read data HB[LP].

In the example shown in FIG. 11, after the read data HB[LP] is stored in the latch circuit CDL at the timing t3 and the read data SB[LP] is stored in the latch circuit BDL at the timing t4, the read data HB[LP] stored in the latch circuit CDL at the timing t5 is transferred to the latch circuit XDL.

Alternatively, before the read data SB[LP] is stored in the latch circuit BDL at the timing t4, the read data HB[LP] stored in the latch circuit CDL may be transferred to the latch circuit XDL.

Then, the sequencer SQC supplies the ground voltage $V_{SS}$ to the selected word line $WL_s$.

Next, the memory die MD controls the external output terminal RBn from the "L" state (busy state) to the "H" state (ready state).

In the example of FIG. 11, after the external output terminal RBn changes from the "L" state to the "H" state, the controller die CD outputs a command set instructing the cache read (hereafter, may also be referred to as a read command for cache read) to the memory die MD via the data signal input and output terminals DQ0 to DQ7. As shown in FIG. 11, the read command for cache read includes data 00h, ADD, and 31h.

The data 00h and the data ADD are the same data as the data 00h and the data ADD of the read command for read operation. The data 31h is the command data CMD to be input to the command register CMR. The data 31h indicates that the input of the command set for cache read is complete.

In response to the input of the command set for cache read, the sequencer SQC controls the external output terminal RBn from the "H" state to the "L" state. Accordingly, an access to the memory die MD is prohibited. Further, the cache read is executed on the memory die MD. At this time, the state indicated by the "True Busy" in FIG. 11 also changes from the "H" state to the "L" state.

Here, during the normal read operation, after the command set instructing the normal read operation is received and the external output terminal RBn changes from the "H" state to the "L" state, the external output terminal RBn is controlled from the "L" state to the "H" state when the read data stored in the latch circuits BDL, CDL in the sense amplifier SA is transferred to the latch circuits ADL, XDL. That is, in the normal read operation, the state of the external output terminal RBn coincides with the "True Busy" in FIG. 11. On the other hand, during the cache read, after the command set instructing the cache read is received and the external output terminal RBn changes from the "H" state to the "L" state, the external output terminal RBn is controlled from the "L" state to the "H" state before the read data stored in the latch circuits BDL, CDL in the sense amplifier SA is transferred to the latch circuits ADL, XDL. That is, during the normal cache read, the state of the external output terminal RBn does not coincide with the "True Busy" in FIG. 11. More specifically, during the cache read, after the command set instructing the cache read is received by the memory die MD, the external output terminal RBn temporarily changes from the "H" state to the "L" state, and immediately returns to the "H" state. When the command set instructing the cache read as a next operation is received and the cache read operation is continued, the next cache read operation will be started after the previous cache read operation is completed. In this case, after the command set instructing a second cache read is received, the external output terminal RBn changes from the "H" state to the "L" state, and returns to the "H" state after the second cache read operation is started.

In the example of FIG. 11, after the external output terminal RBn changes in an order of the "H" state, the "L" state, and the "H" state in order to indicate that the memory die MD received the command set instructing the cache read, the controller die CD outputs a command set instructing data out (hereafter, may also be referred to as a data out command) to the memory die MD via the data signal input and output terminals DQ0 to DQ7. As shown in FIG. 11, the data out command includes data 05h, ADD, and E0h.

The data 05h is the command data CMD to be input to the command register CMR. The data 05h is input at the start of the data out. The data ADD is the same data as the data ADD of the read command for read operation. The data E0h is the command data CMD to be input to the command register CMR. The data E0h indicates that the input of the data out command is complete.

Figure 18:
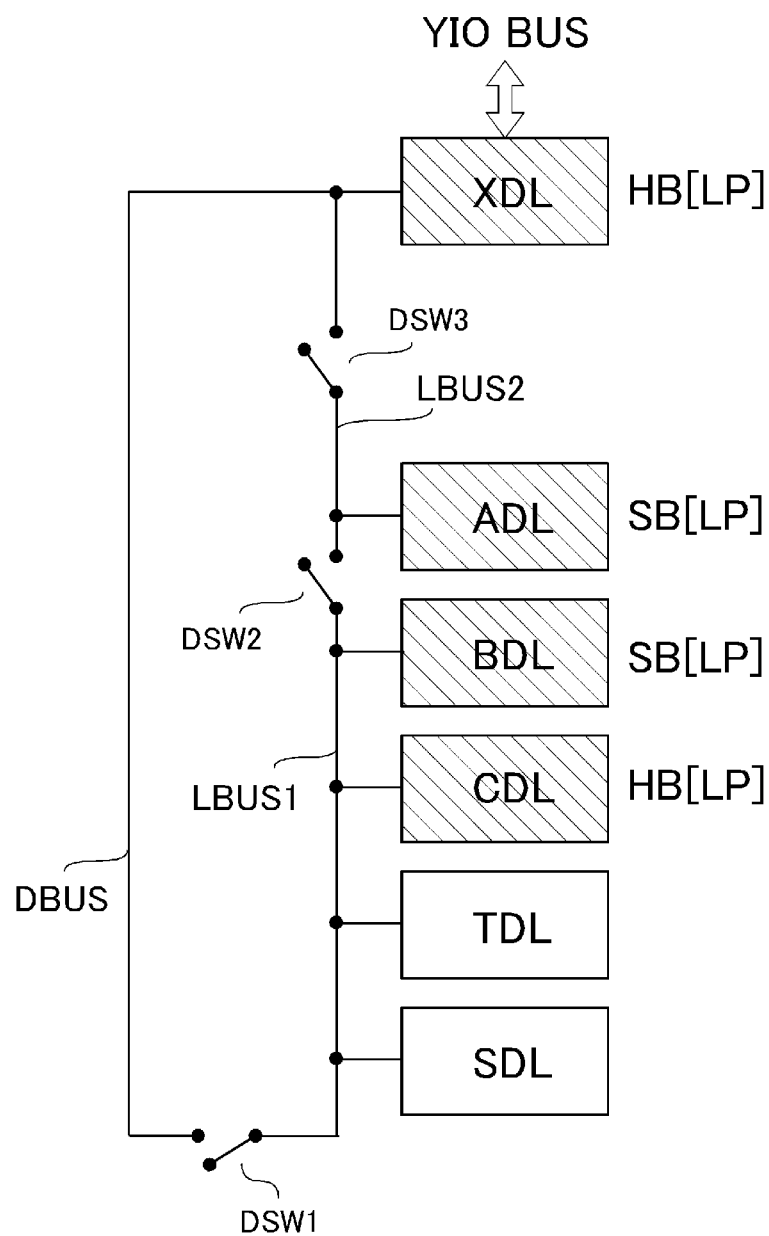

FIG. 18 shows a flow of the read data at a timing t7 of FIG. 11. As shown in FIG. 18, the sequencer SQC controls all the switch transistors DSW1, DSW2 and DSW3 to the OFF state. In the example of FIG. 11, when the data out command is input, data transfer or the like between the latch circuits in the sense amplifier SA is not performed. Alternatively, the data transfer or the like between the latch circuits in the sense amplifier SA may be performed in parallel with the input of the data out command.

Figure 19:
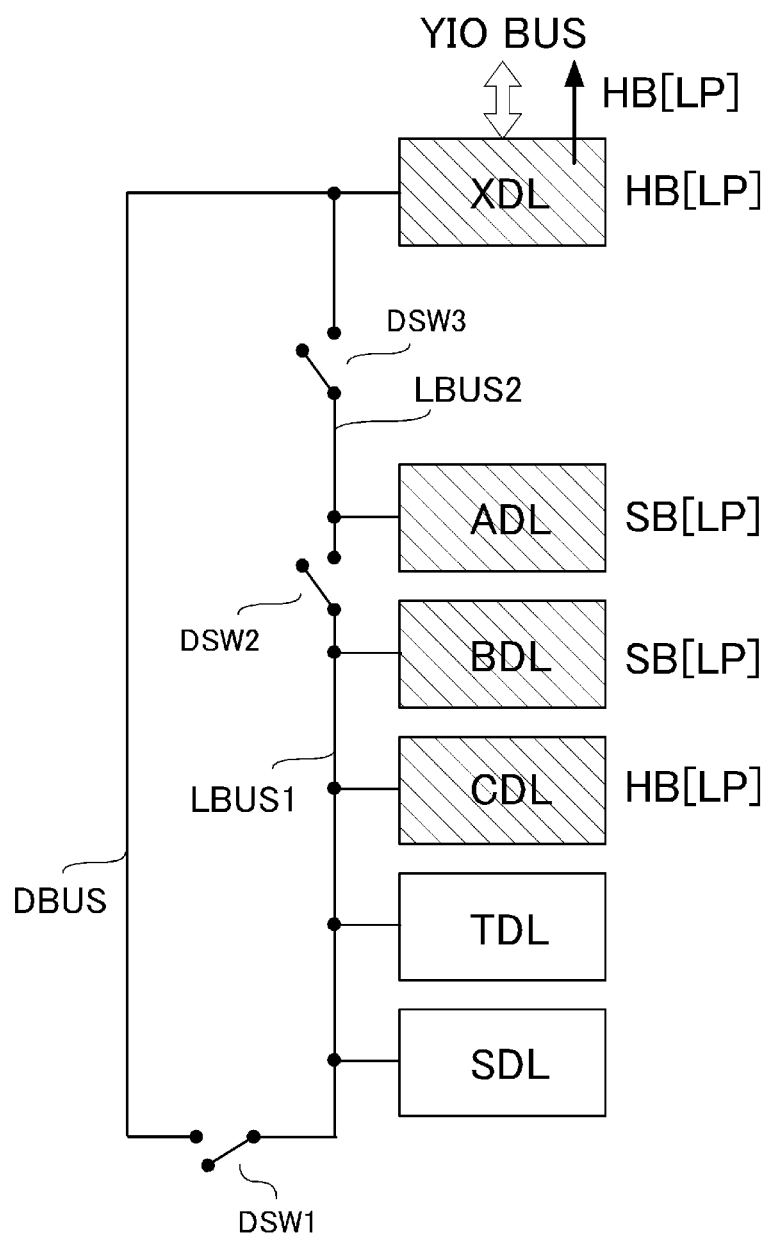

FIG. 19 shows a flow of the read data HB[LP] at a timing t8 of FIG. 11. As shown in FIG. 19, in response to the input of the data out command, the sequencer SQC outputs the read data HB[LP] stored in the latch circuit XDL to the controller die CD via the bidirectional bus YIO, the input and output control circuit I/O, and the data signal input and output terminals DQ0 to DQ7.

As shown in FIG. 11, during the read operation, the sequencer SQC supplies the read pass voltage $V_{READ}$ to the selected word line $WL_s$.

Thereafter, the sequencer SQC supplies the read voltage $V_{CGFR}$ to the selected word line $WL_s$. Accordingly, the memory cells MC corresponding to the Er state to the E state in FIG. 8A are in the ON state, and the memory cells MC corresponding to the F state to the G state are in the OFF state. In addition, the sequencer SQC charges the bit lines BL. The sequencer SQC charges the wiring LBUS1 by controlling the charge transistor 55 for precharging (FIG. 5). At this time, the switch transistors DSW1, DSW2, and DSW3 are all in the OFF state. Meanwhile, the output of the read data HB[LP] stored in the latch circuit XDL to the controller die CD may be executed in parallel with supply of the voltage to the selected word line $WL_s$ during the read operation.

Figure 20:
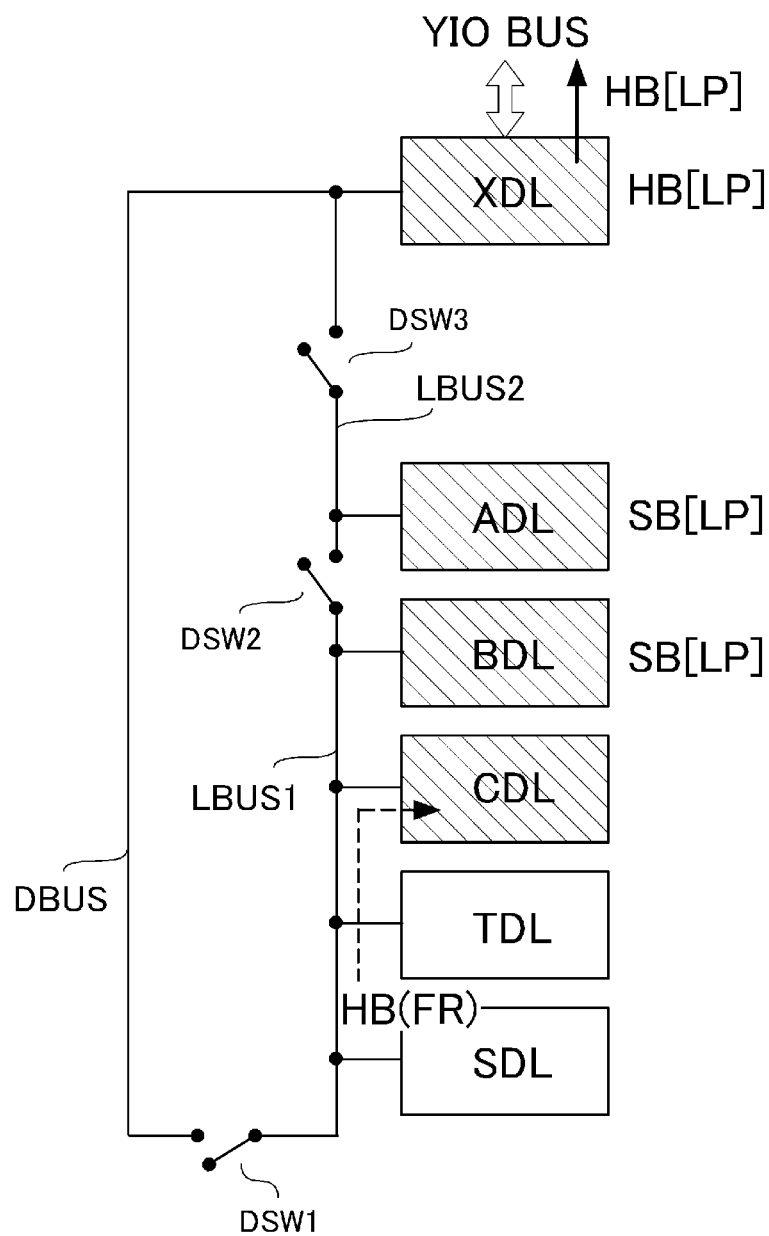

The sequencer SQC executes a sense operation ("sense FR (HB)" in FIG. 11) corresponding to the hard bit read. Accordingly, the sense amplifier SA obtains read data (read data HB (FR)) corresponding to the read voltage $V_{CGFR}$ FIG. 20 shows a flow of the read data HB (FR) at a timing t9 of FIG. 11. As shown in FIG. 20, the read data HB (FR) obtained by the sense operation is transferred to the latch circuit CDL via the wiring LBUS1. The latch circuit CDL stores the read data HB (FR).

Figure 21:
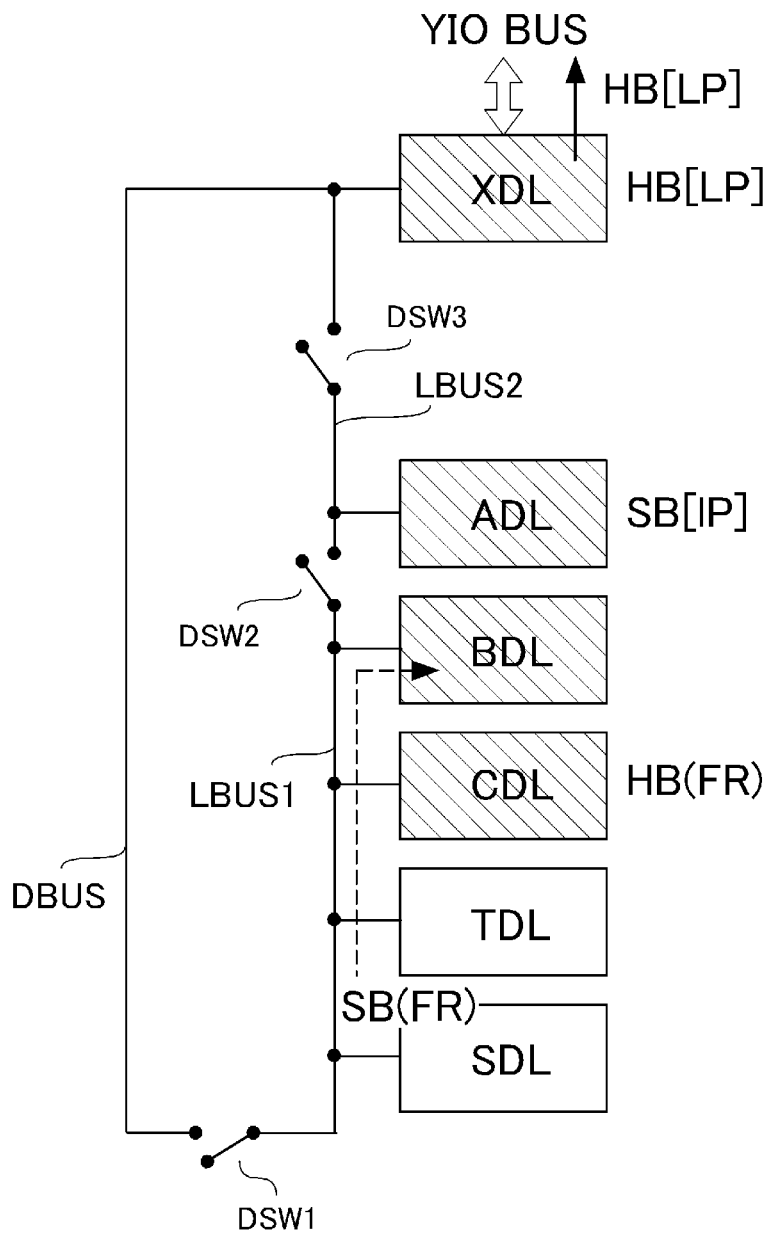

Further, the sequencer SQC executes a sense operation ("sense FR (SB+)" in FIG. 11) corresponding to the soft bit read. Accordingly, the sense amplifier SA obtains read data (read data SB (FR)) corresponding to the read voltage $V_{CGFR}$ FIG. 21 shows a flow of the read data SB (FR) at a timing t10 of FIG. 11. As shown in FIG. 21, the read data SB (FR) obtained by the sense operation is transferred to the latch circuit BDL via the wiring LBUS1. The latch circuit BDL stores the read data SB (FR).

Next, the sequencer SQC supplies the read voltage $V_{cGDR}$ to the selected word line $WL_s$. Accordingly, the memory cells MC corresponding to the Er state to the C state in FIG. 8A are in the ON state, and the memory cells MC corresponding to the D state to the G state are in the OFF state.

In the example of FIG. 11, when the data out is completed, the controller die CD outputs a command that instructs the transfer of read data (hereinafter, may also be referred to as a transfer command) to the memory die MD via the data signal input and output terminals DQ0 to DQ7. As shown in FIG. 11, the transfer command is a command for data XXh.

Further, eight-bit data constituting the data XXh may be "0" or "1". Among the eight-bit data constituting the data XXh, data from a first bit to a fourth bit and data from a fifth bit to an eighth bit may be the same or different.

Figure 22:
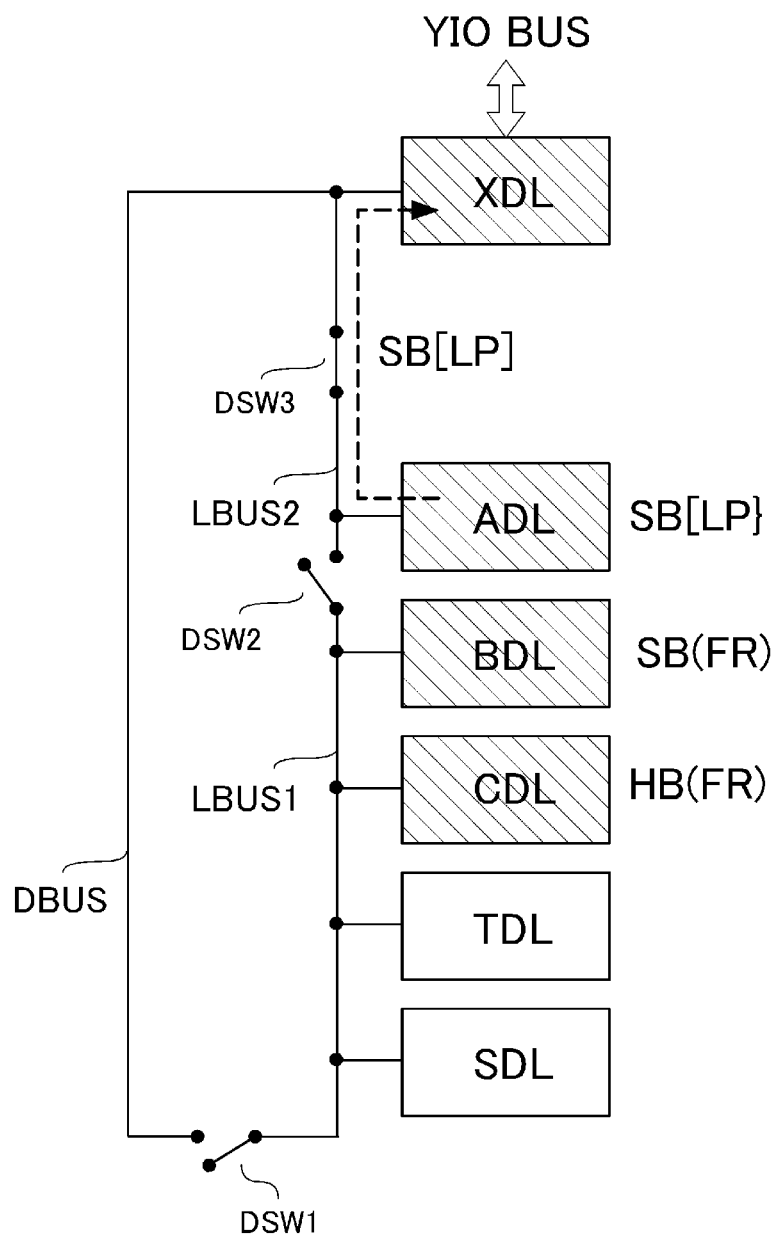

FIG. 22 shows a flow of the read data SB[LP] at a timing t11 of FIG. 11. As shown in FIG. 22, in response to the input of the transfer command, the sequencer SQC controls the switch transistors DSW1, DSW2 to the OFF state and controls the switch transistor DSW3 to the ON state. The sequencer SQC further controls the external output terminal RBn from the "H" state to the "L" state. The sequencer SQC transfers the read data SB[LP] stored in the latch circuit ADL to the latch circuit XDL via the wirings LBUS2, DBUS. As a result, the latch circuit XDL stores the read data SB[LP].

At the timing t11 of FIG. 11, the sequencer SQC executes a sense operation ("sense DR (HB)" in FIG. 11) corresponding to the hard bit read in parallel with the transfer of the read data SB[LP] from the latch circuit ADL to the latch circuit XDL. Accordingly, the sense amplifier SA obtains read data (read data HB (DR)) corresponding to the read voltage $V_{CGDR}$.

In the present embodiment, a current path between the wiring LBUS1 and the wiring LBUS2 is established or cut off according to the ON state or the OFF state of the switch transistor DSW2. Further, a current path between the wiring LBUS2 and the wiring DBUS is established or cut off according to the ON state or the OFF state of the switch transistor DSW3. The wiring LBUS2 is connected to the latch circuit ADL. Therefore, even during the execution of the sense operation corresponding to the hard bit read or the soft bit read and the transfer operation of the read data to the latch circuits CDL, BDL, and the like, the sense amplifier module SAM can execute the transfer operation of the read data previously stored in the latch circuit ADL to the latch circuit XDL in parallel.

Figure 23:
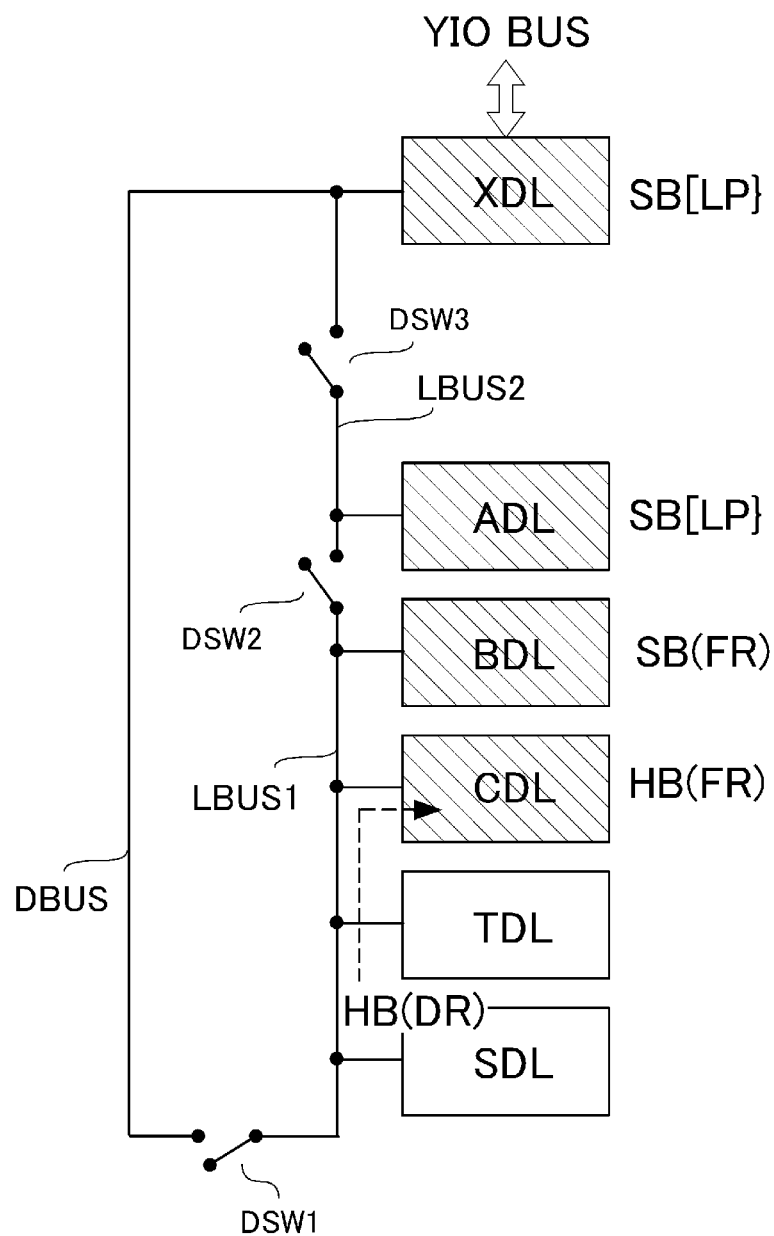

FIG. 23 shows a flow of the read data HB (DR) at a timing t12 of FIG. 11. When the transfer of the read data SB[LP] from the latch circuit ADL to the latch circuit XDL is completed, the sequencer SQC controls all the switch transistors DSW1, DSW2, and DSW3 to the OFF state. When the transfer of the read data SB[LP] from the latch circuit ADL to the latch circuit XDL is completed, the memory die MD controls the external output terminal RBn from the "L" state to the "H" state.

As shown in FIG. 23, the read data HB (DR) obtained by the sense operation is transferred to the latch circuit CDL. At this time, the read data HB (FR) is stored in the latch circuit CDL. The sense amplifier SA performs the predetermined logical operation on the read data HB (FR) and the read data HB (DR). The latch circuit CDL stores a result HB (FR/DR) of this logical operation.

Further, the sequencer SQC executes a sense operation ("sense DR (SB+)" in FIG. 11) corresponding to the soft bit read. Accordingly, the sense amplifier SA obtains read data (read data SB (DR)) corresponding to the read voltage $V_{CGDR}$.

Figure 24:
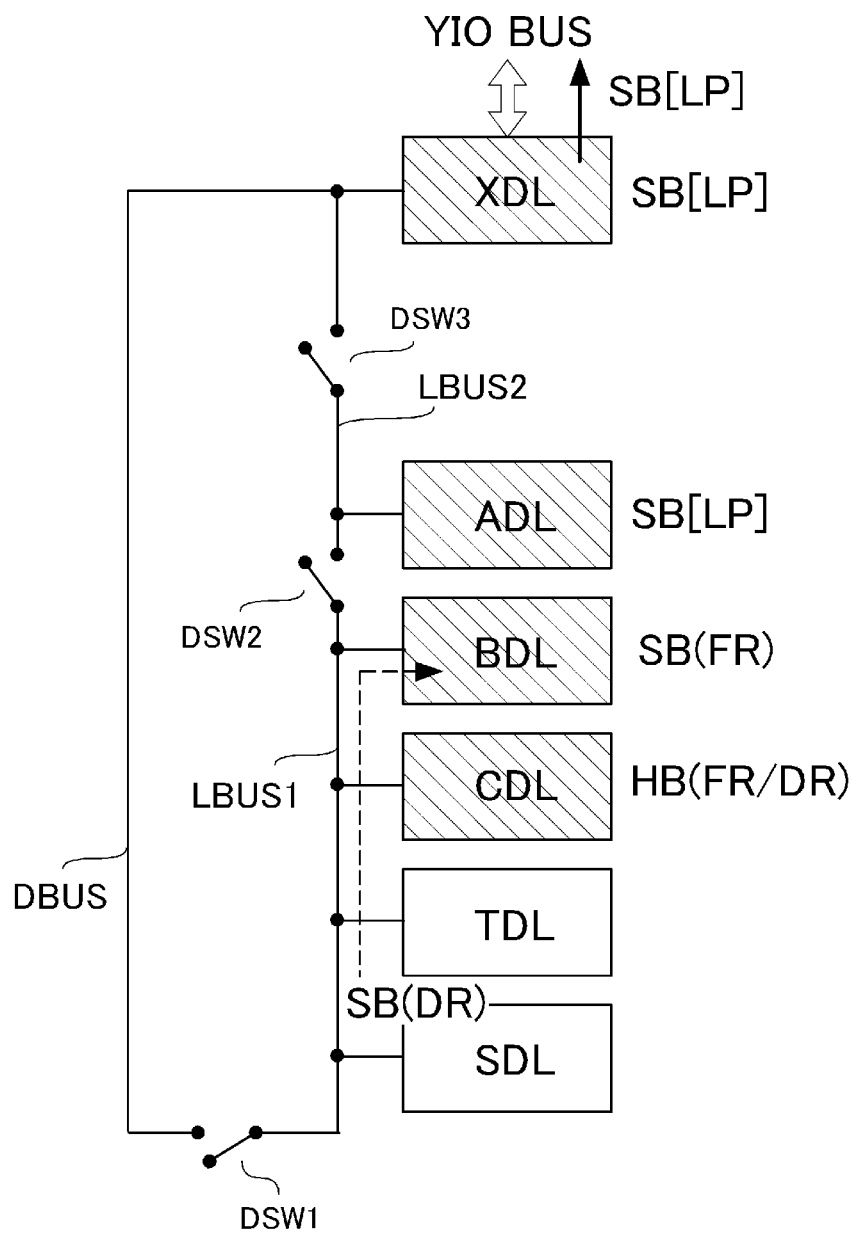

FIG. 24 shows a flow of the read data SB (DR), SB[LP] at timings t13, t14 of FIG. 11. As shown in FIG. 24, at the timing t13, the read data SB (DR) obtained by the sense operation is transferred to the latch circuit BDL. At this time, the read data SB (FR) is stored in the latch circuit BDL. The sense amplifier SA performs the predetermined logical operation on the read data SB (FR) and the read data SB (DR). The latch circuit BDL stores a result SB (FR/DR) of this logical operation.

In the example of FIG. 11, after the transfer operation is completed, the controller die CD outputs the data out command to the memory die MD via the data signal input and output terminals DQ0 to DQ7.

As shown in FIG. 24, at the timing t14, in response to the input of the data out command, the sequencer SQC outputs the read data SB[LP] stored in the latch circuit XDL to the controller die CD via the bidirectional bus YIO, the input and output control circuit I/O, and the data signal input and output terminals DQ0 to DQ7.

The controller die CD performs the bit error detection/correction and the like on the data output from the memory die MD, and then transfers the data to the host computer 20 (FIG. 1).

Then, the sequencer SQC supplies the read voltage $V_{CGBR}$ to the selected word line $WL_s$. The sequencer SQC executes a sense operation ("sense BR (HB)" in FIG. 11) corresponding to the hard bit read. At a timing t15, read data HB (BR) obtained by the sense operation is transferred to the latch circuit CDL. At this time, read data HB (FR/DR) is stored in the latch circuit CDL. The sense amplifier SA performs the predetermined logical operation on the read data HB (FR/DR) and the read data HB (BR). The latch circuit CDL stores a result HB (FR/DR/BR) of this logical operation. The result HB (FR/DR/BR) of this logical operation is read data HB[MP] of the middle bit (middle page).

Further, the sequencer SQC executes a sense operation ("sense BR (SB+)" in FIG. 11) corresponding to the soft bit read. At a timing t16, read data SB (BR) obtained by the sense operation is transferred to the latch circuit BDL. At this time, read data SB (FR/DR) is stored in the latch circuit BDL. The sense amplifier SA performs the predetermined logical operation on the read data SB (FR/DR) and the read data SB (BR). The latch circuit BDL stores a result SB (FR/DR/BR) of this logical operation. The result SB (FR/DR/BR) of this logical operation is read data SB[MP] of the middle bit (middle page).

Then, the read data HB[MP] is transferred to the latch circuit XDL via the wirings LBUS1, DBUS. In response to the input of the data out command, the read data HB[MP] stored in the latch circuit XDL is output via the bidirectional bus YIO. Further, the read data SB[MP] is transferred to the latch circuit ADL via the wirings LBUS1, LBUS2, and is transferred to the latch circuit XDL via the wirings LBUS2, DBUS. In response to the input of the data out command, the read data SB[MP] stored in the latch circuit XDL is output via the bidirectional bus YIO.

In the examples of FIGS. 11 to 24, the read operations of the lower bit and the middle bit are illustrated, and it is also possible to execute a read operation of the upper bit. Basically, the read operation of the upper bit is executed in the same manner as the read operations of the lower bit and the middle bit. It is noted that, during the read operation of the upper bit, first, the read voltage $V_{CGGR}$ is supplied to the selected word line $WL_s$, and the sense operations corresponding to the hard bit read and the soft bit read are performed. Further, the read data obtained by the sense operation is transferred. Then, the read voltage $V_{CGCR}$ is supplied to the selected word line $WL_s$, and the sense operations corresponding to the hard bit read and the soft bit read are performed. The read data obtained by the sense operations is transferred.

[Comparative Example]

Next, operations of the sense amplifier module SAM according to a comparative example will be described with reference to FIGS. 25 and 26.

Figure 25:
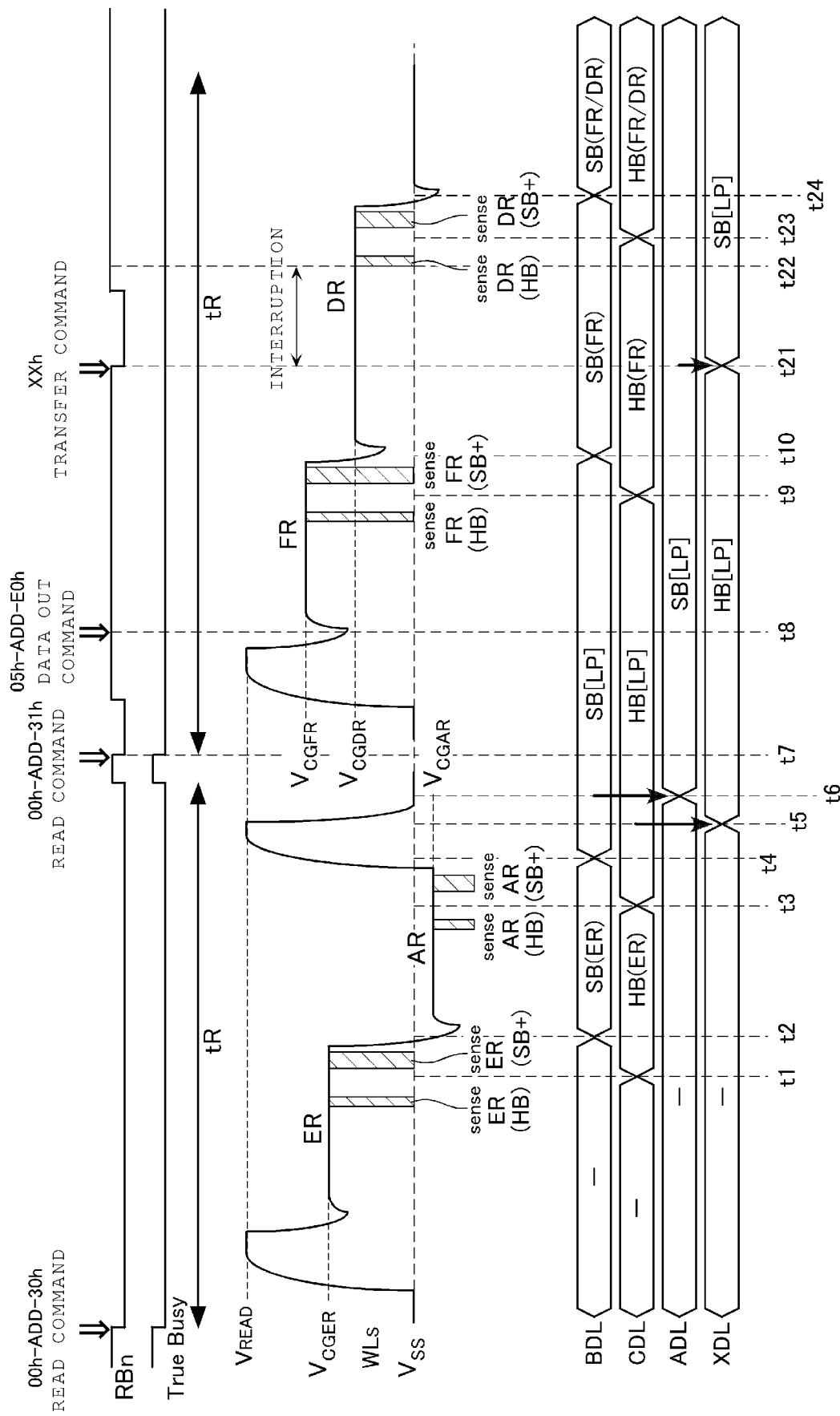
FIG. 25 is a diagram showing timings of operations of a sense amplifier module according to a comparative example.

FIG. 25 is a diagram showing timings of the operations of the sense amplifier module SAM according to the comparative example. FIG. 26 is a block diagram showing data exchange among a plurality of latch circuits according to the comparative example. In FIGS. 25 and 26, the same reference numerals are attached to components similar to those of FIGS. 11 to 24, and the descriptions thereof are omitted.

Figure 26:
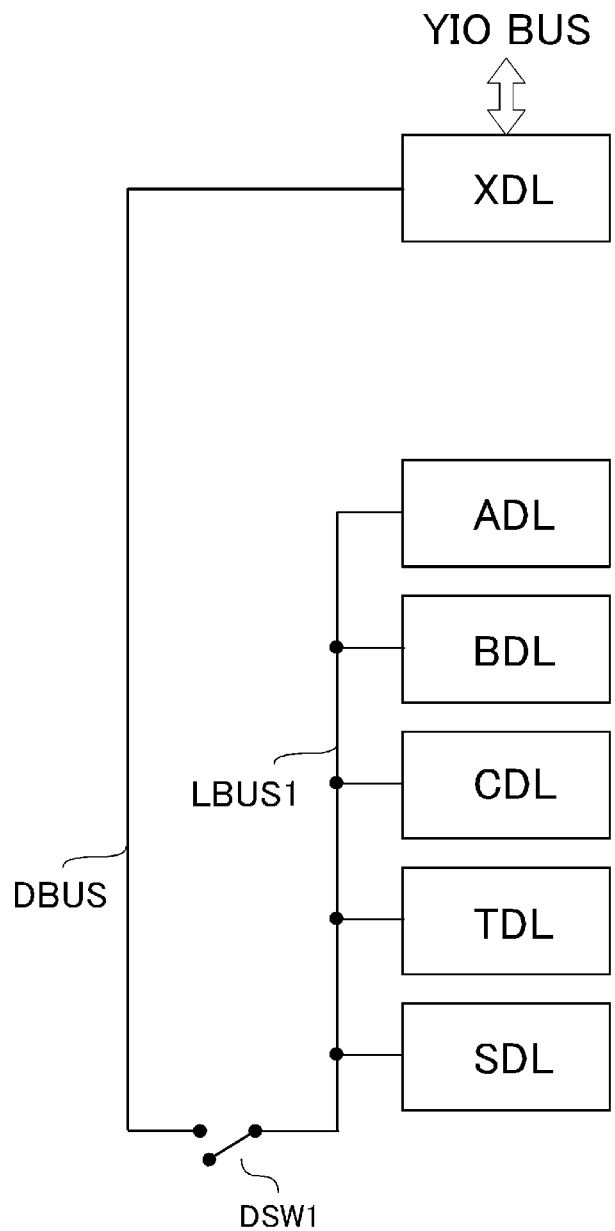
FIG. 26 is a block diagram showing data exchange among a plurality of latch circuits according to the comparative example.

As shown in FIG. 26, in a sense amplifier module according to the comparative example, all the latch circuits SDL, ADL, BDL, CDL, and TDL are connected to the wiring LBUS1. The sense amplifier module according to the comparative example is not provided with the wiring LBUS2 or the switch transistors DSW2 and DSW3. Therefore, data stored in the latch circuits SDL, ADL, BDL, CDL, and TDL is transferred to the latch circuit XDL via only one route including the wiring LBUS1 and the wiring DBUS.

[Operations of Sense Amplifier Module SAM]

In the example of FIG. 25, after the data out is completed, the controller die CD outputs the transfer command to the memory die MD via the data signal input and output terminals DQ0 to DQ7.

At a timing t21, in response to the input of the transfer command, the sequencer SQC controls the switch transistor DSW1 to the ON state. The sequencer SQC further controls the external output terminal RBn from the "H" state to the "L" state. The sequencer SQC interrupts the read operation of the sense amplifier module SAM. Then, the sequencer SQC transfers the read data SB[LP] stored in the latch circuit ADL to the latch circuit XDL via the wirings LBUS1, DBUS. The latch circuit XDL stores the read data SB[LP].

In the sense amplifier module SAM according to the comparative example, the read data obtained by the sense operation is transferred to the latch circuit (for example, the latch circuit CDL or BDL) via the wiring LBUS1. The read data SB[LP] stored in the latch circuit ADL is transferred to the latch circuit XDL via the wirings LBUS1, DBUS. In this way, since the wiring LBUS1 is used for both the transfer of the read data from the sense amplifier SA to the latch circuit and the transfer of the read data SB[LP] from the latch circuit ADL to the latch circuit XDL, these operations (processing) cannot be simultaneously performed. Therefore, when the transfer command is received, the sequencer SQC needs to interrupt the read operation until the transfer of the read data SB[LP] from the latch circuit ADL to the latch circuit XDL is completed (a period of time from the timing t21 to a timing t22). Alternatively, when the transfer command is received, the sequencer SQC needs to wait for the transfer of the read data SB[LP] from the latch circuit ADL to the latch circuit XDL until the read operation is completed.

In such a case, the read operation is delayed. Alternatively, the reception of the read data SB[LP] by the controller die CD via the latch circuit XDL, the bidirectional bus YIO, the input and output control circuit I/O and the data signal input and output terminals DQ0 to DQ7 is delayed.

[Effects of First Embodiment]

In the sense amplifier module SAM according to the first embodiment, even during the execution of the read operation, the read data SB[LP] can be immediately transferred from the latch circuit ADL to the latch circuit XDL in response to the input of the transfer command. That is, the read operation such as the sense operation of the sense amplifier and the transfer operation of the read data SB[LP] from the latch circuit ADL to the latch circuit XDL can be executed in parallel. Therefore, the memory die MD can provide the read data HB[LP] and SB[LP] to the controller die CD at a relatively high speed without interrupting the read operation in the sense amplifier module SAM. As a result, the host computer 20 (that is, a user) can obtain the read data at a relatively high speed.

Further, the sense amplifier module SAM according to the first embodiment is implemented by adding the two switch transistors DSW2 and DSW3 without adding a latch circuit. Therefore, in the sense amplifier module SAM, an influence on an element region due to the addition of an element is prevented.

[Second Embodiment]

Figure 27:
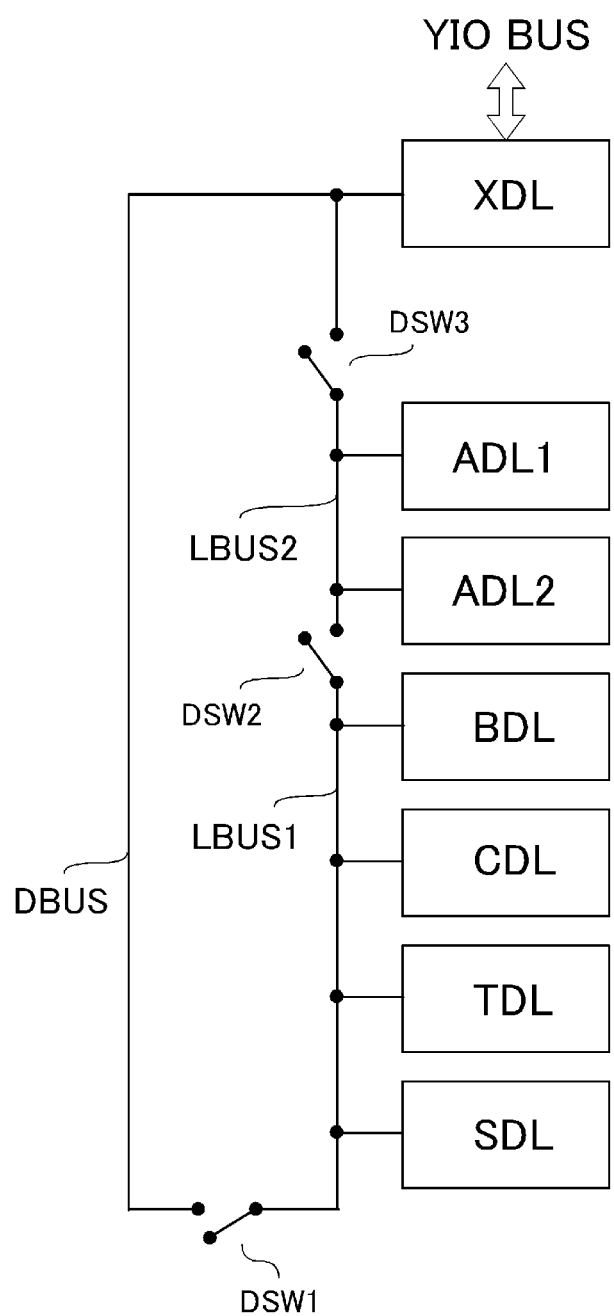
FIG. 27 is a schematic block diagram showing a part of a configuration of a semiconductor storage device according to a second embodiment.

FIG. 27 is a schematic block diagram showing a part of a configuration of a semiconductor storage device according to the second embodiment. FIG. 27 shows a configuration of a plurality of latch circuits in the sense amplifier unit SAU of the semiconductor storage device according to the second embodiment. In FIG. 27, the same reference numerals are attached to the same components as those of FIGS. 11 to 24, and the descriptions thereof are omitted.

The semiconductor storage device according to the second embodiment is basically configured in the same manner as the semiconductor storage device according to the first embodiment. It is noted that, as described with reference to FIG. 5 and the like, in the sense amplifier unit SAU according to the first embodiment, only one latch circuit ADL is connected to the wiring LBUS2. In contrast, in the sense amplifier unit SAU according to the second embodiment, two latch circuits ADL1 and ADL2 are connected to the wiring LBUS2.

In such a configuration, the sense amplifier SA can execute three sense operations of the hard bit read, the soft bit read on a positive side, and the soft bit read on a negative side. The read data HB obtained by the sense operation corresponding to the hard bit read may be stored in the latch circuit CDL. Read data SB+ obtained by the sense operation corresponding to the soft bit read on the positive side may be stored in the latch circuit BDL. Read data SB− obtained by the sense operation corresponding to the soft bit read on the negative side may be stored in, for example, the latch circuit SDL or the latch circuit TDL.

Further, the read data HB stored in the latch circuit CDL may be transferred to the latch circuit XDL via the wiring DBUS. The read data SB+ stored in the latch circuit BDL may be transferred to the latch circuits ADL1 via the wirings LBUS1, LBUS2. The read data SB− stored in the latch circuit SDL or the latch circuit TDL may be transferred to the latch circuits ADL2 via the wirings LBUS1, LBUS2. After the read data HB stored in the latch circuit XDL is output to the controller die CD, the read data SB+ stored in the latch circuit ADL1 may be transferred to the latch circuit XDL via the wirings LBUS2, DBUS. The read data SB− stored in the latch circuit ADL2 may be transferred to the latch circuit XDL via the wirings LBUS2, DBUS. The latch circuit XDL may store a result of a logical operation (for example, XNOR) between the read data SB+ transferred from the latch circuit ADL1 and the read data SB−. Then, the data stored in the latch circuit XDL is output to the controller die CD.

According to such a configuration, the memory die MD can output data including information on the positive side and the negative side as the read data SB while reducing the amount of data.

[Third Embodiment]

Figure 28:
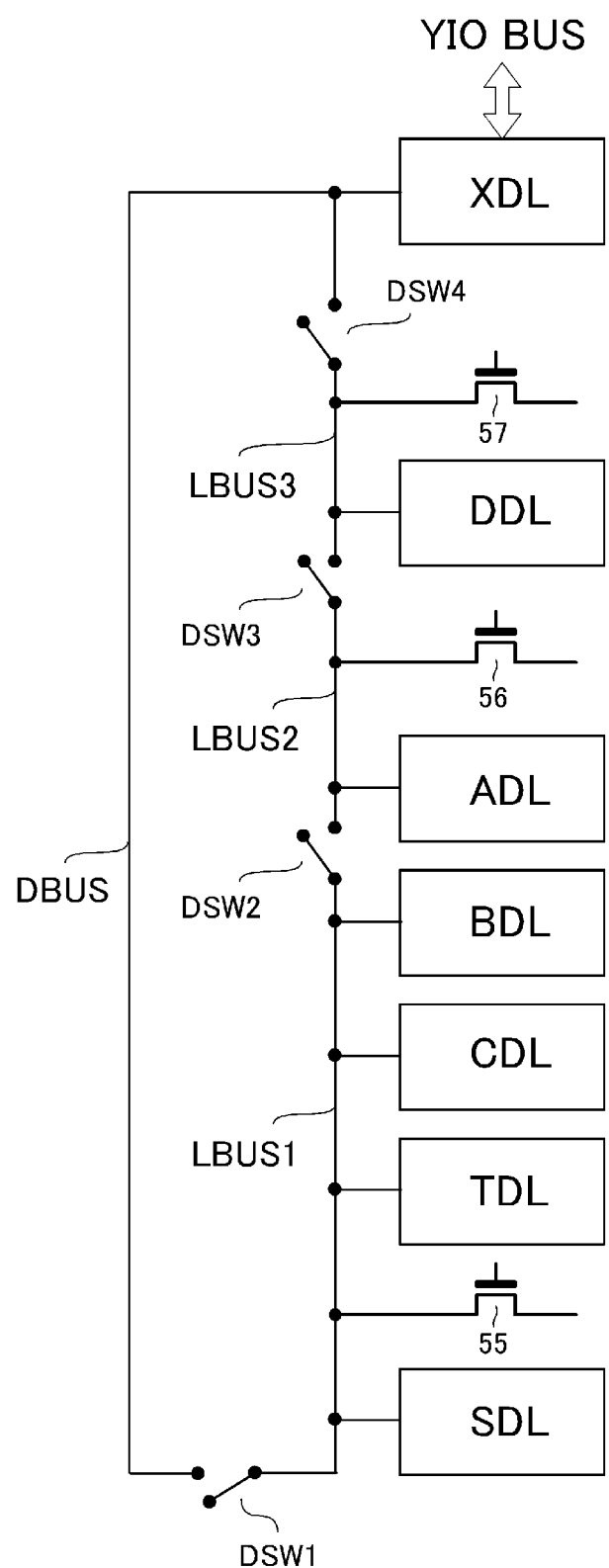
FIG. 28 is a schematic block diagram showing a part of a configuration of a semiconductor storage device according to a third embodiment.

FIG. 28 is a schematic block diagram showing a part of a configuration of a semiconductor storage device according to the third embodiment. FIG. 28 shows a configuration of a plurality of latch circuits in the sense amplifier unit SAU of the semiconductor storage device according to the third embodiment. In FIG. 28, the same reference numerals are attached to the same components as those of FIGS. 11 to 24, and the descriptions thereof are omitted.

The semiconductor storage device according to the third embodiment is basically configured in the same manner as the semiconductor storage device according to the first embodiment. It is noted that, in the sense amplifier module SAM according to the third embodiment, a switch transistor DSW4 and a wiring LBUS3 are provided between the switch transistor DSW3 and the wiring DBUS. A latch circuit DDL and a charge transistor 57 for precharging are connected to the wiring LBUS3. The switch transistor DSW4 is connected to the wiring DBUS.

In such a configuration, the sense amplifier SA can execute three sense operations of the hard bit read, the soft bit read on a positive side, and the soft bit read on a negative side as in the second embodiment. For example, the read data SB+ on the positive side may be stored in the latch circuit ADL, and the read data SB− on the negative side may be stored in the latch circuit DDL. In this case, the sequencer SQC can separately transfer the read data SB+ on the positive side and the read data SB− on the negative side to the latch circuit XDL, and can output those read data separately to the controller die CD.

[Fourth Embodiment]

Figure 29:
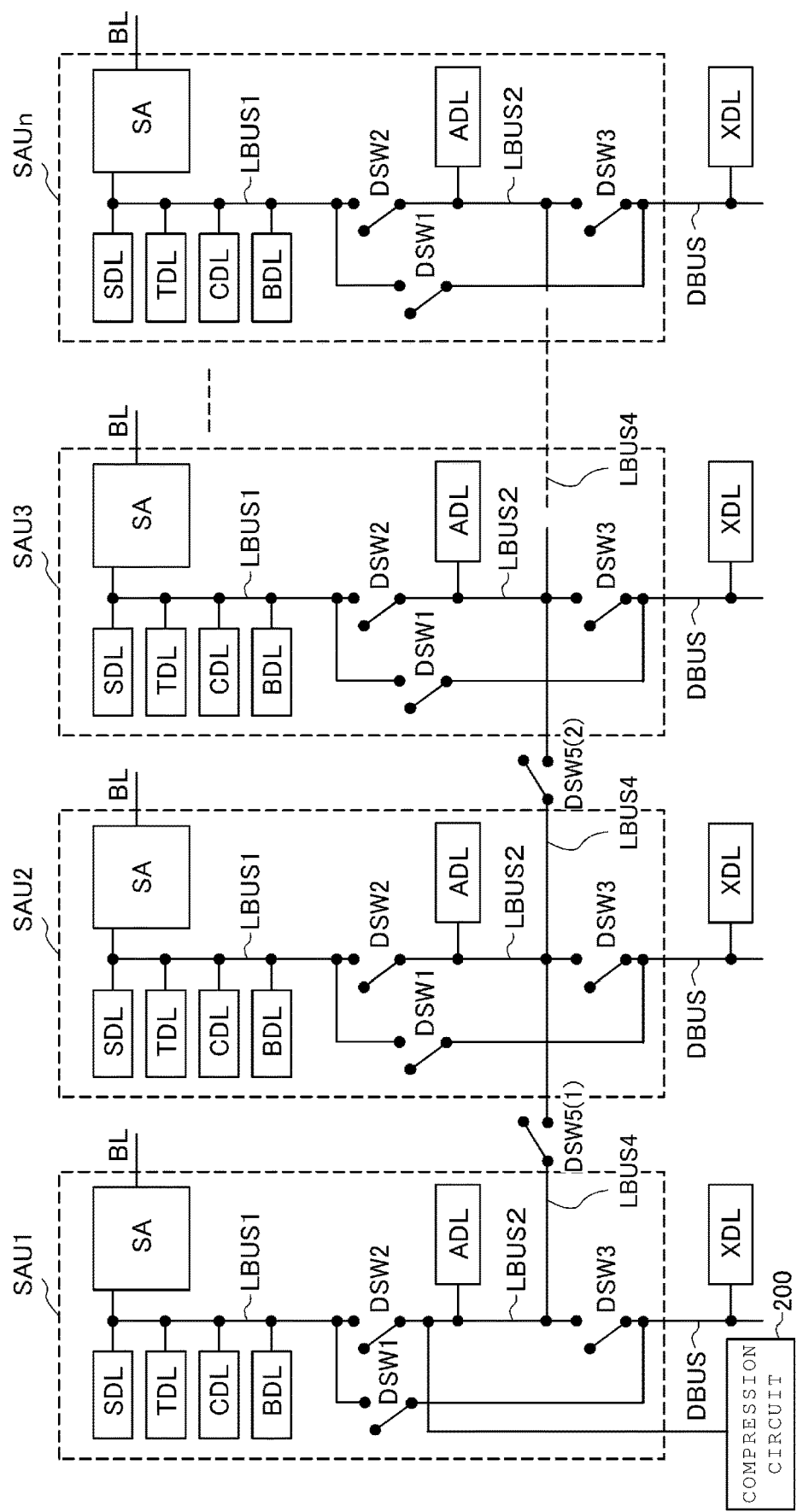
FIG. 29 is a schematic block diagram showing a part of a configuration of a semiconductor storage device according to a fourth embodiment.

FIG. 29 is a schematic block diagram showing a part of a configuration of a semiconductor storage device according to the fourth embodiment. FIG. 29 is a schematic block diagram showing a configuration of the sense amplifier module SAM of the semiconductor storage device according to the fourth embodiment, which is provided in the sense amplifier unit SAU of the semiconductor storage device according to the second embodiment. In FIG. 29, the same reference numerals are attached to the same components as those of FIGS. 11 to 24, and the descriptions thereof are omitted.

The semiconductor storage device according to the fourth embodiment is basically configured in the same manner as the semiconductor storage device according to the first embodiment. However, the sense amplifier module SAM according to the fourth embodiment has a configuration different from that of the sense amplifier module SAM according to the fourth embodiment.

As shown in FIG. 29, the sense amplifier module SAM according to the fourth embodiment includes a plurality of sense amplifier units SAU1 to SAUn corresponding to a plurality of bit lines BL. Each of the sense amplifier units SAU1 to SAUn has the same configuration as the sense amplifier unit SAU described with reference to FIG. 5.

Here, in the illustrated example, among the sense amplifier units SAU1 to SAUn, the wiring LBUS2 of the k-th sense amplifier unit SAUk (k is an integer of 1 or more and n−1 or less) and the wiring LBUS2 of the (k+1)th sense amplifier unit SAU(k+1) are electrically connected via a wiring LBUS4 and a switch transistor DSW5 (k). Further, the wiring LBUS2 of the sense amplifier unit SAU1 is connected to a compression circuit 200.

The compression circuit 200 may be connected to the wiring LBUS2 of another sense amplifier unit other than the sense amplifier unit SAU1. Alternatively, the compression circuit 200 may be connected to the wiring LBUS4. In addition, the compression circuit 200 may be provided in the sense amplifier module SAM, and also may be provided outside the sense amplifier module SAM.

In such a configuration as described above, the read data SB stored in the latch circuit ADL of each of the sense amplifier units SAU1 to SAUn is transferred to the compression circuit 200 before being transferred to the latch circuit XDL. For example, when the read data SB stored in the latch circuit ADL of the sense amplifier unit SAU2 is transferred to the compression circuit 200, a switch transistor DSW5 (1) is controlled to the ON state. Further, when the read data SB stored in the latch circuit ADL of the sense amplifier unit SAU3 is transferred to the compression circuit 200, the switch transistor DSW5 (1) and a switch transistor DSW5 (2) are controlled to the ON state.

For example, it is assumed that the number of sense amplifier units SAU1 to SAUn connected by the wiring LBUS4 is 16 (n=16). In this case, the read data SB is data in a unit of 16 bits by being transferred from each of the sense amplifier units SAU1 to SAU16 to the compression circuit 200. The compression circuit 200 compresses the data in a unit of 16 bits into, for example, 4-bit data.

For example, each of the sense amplifier unit SAU1 to SAU16 transfers the read data HB and the read data SB to the compression circuit 200. The compression circuit includes, for example, an XOR circuit and a counter. The compression circuit 200 compares, for example, 16-bit data of the read data HB with 16-bit data of the read data SB. When the k-th bit of the read data SB matches the k-th bit of the read data HB, a counter value is incremented, and when the k-th bit of the read data SB does not match the k-th bit of the read data HB, the counter value is output. Therefore, the compression circuit 200 can recognize which bit of the 16-bit data of the read data SB is different from the data of the read data HB.

The compression circuit 200 may transfer the compressed data to the latch circuit XDL. Further, the number of sense amplifier units SAU1 to SAUn connected by the wiring LBUS4 is not limited to 16 (n=16), and may be 64 (n=64), 128 (n=128), 256 (n=256), or the like. In this case, the compression circuit 200 executes a compression operation on data in units of 64 bits, 128 bits, and 256 bits.

According to such a configuration, the amount of the read data SB output from the latch circuit XDL can be reduced.

[Other Embodiments]

The semiconductor storage devices according to the embodiments are described above. However, the above descriptions are merely examples, and the above-described configurations and methods can be modified appropriately.

For example, the semiconductor storage device according to the first embodiment may execute the three sense operations corresponding to the hard bit read, the soft bit read on the positive side, and the soft bit read on the negative side. In this case, the latch circuit BDL stores the result of the logical operation (for example, XNOR) between the sense result (read data SB+) of the sense operation corresponding to the soft bit read on the positive side and the sense result (read data SB−) of the sense operation corresponding to the soft bit read on the negative side. Then, the data stored in the latch circuit BDL is transferred to the latch circuit XDL.

In the above description, an example of executing the sense operations corresponding to the hard bit read and the soft bit read as the read operations according to the first embodiment to the fourth embodiment is shown. However, such an operation method is merely an example, and a specific operation method, a usage method, and the like can be appropriately adjusted. For example, the memory system 10 may have a function called sequential read, which collectively reads data of the lower page, the middle page and an upper page. During the sequential read, in a case of triple level cell (TLC), when the data corresponding to the three pages of the lower page, the middle page and the upper page is prepared, the data is output.

For example, when the sequential read is applied in the sense amplifier module SAM according to the third embodiment, the latch circuit CDL may store the data of the lower page, the latch circuit ADL may store the data of the middle page, and the latch circuit DDL may store the data of the upper page. The data stored in the latch circuits CDL, ADL, and DDL may be sequentially transferred to the latch circuit XDL.

In addition, the sense amplifier modules SAM according to the first embodiment to the fourth embodiment are described by using the read operation as examples. Alternatively, the embodiments are not limited to such configurations, and the sense amplifier module SAM may be applied to the write operation, a verify operation, and the like. For example, a quick-pass write operation may be performed in which a plurality of verify voltages are set for one threshold voltage level and a program voltage is changed. In this case, by using a latch circuit (ADL or the like) connected to a wiring (LBUS2 or the like) that can be electrically disconnected from the wiring LBUS1, the data transfer between the latch circuit (ADL or the like) and the latch circuit XDL may be performed in parallel with the verify operation.

The memory system 10 according to the first embodiment to the fourth embodiment is described as a configuration using the memory cells MC of the TLC. The memory system 10 may have a configuration using memory cells of a single level cell (SLC), a multi-level cell (MLC), a quad level cell (QLC), or a penta level cell (PLC).

[Others]

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
a memory string;
a bit line connected to the memory string;
a sense amplifier connected to the bit line;
first, second, third, and fourth latch circuits that are each connected to the sense amplifier;
a first wiring connected to the sense amplifier, the first latch circuit, and the second latch circuit;
a second wiring connected to the third latch circuit;
a third wiring connected to the fourth latch circuit;
a first switch transistor between the first wiring and the third wiring;
a second switch transistor between the first wiring and the second wiring; and
a third switch transistor between the second wiring and the third wiring.

2. The semiconductor storage device according to claim 1, wherein
the first latch circuit stores a first output of the sense amplifier at a first timing of a read operation,
the second latch circuit stores a second output of the sense amplifier at a second timing of the read operation, that is later than the first timing,
first data stored in the first latch circuit is transferred from the first latch circuit to the fourth latch circuit via the first wiring and the third wiring at a third timing of the read operation, that is later than the second timing,
second data stored in the second latch circuit is transferred from the second latch circuit to the third latch circuit via the first wiring and the second wiring at a fourth timing of the read operation, that is later than the third timing, and
the second data is transferred from the third latch circuit to the fourth latch circuit via the second wiring and the third wiring at a fifth timing of the read operation, that is later than the fourth timing.

3. The semiconductor storage device according to claim 2, wherein
the second data is transferred from the third latch circuit to the fourth latch circuit in response to an input of a transfer command.

4. The semiconductor storage device according to claim 1, further comprising:
a first charge transistor, a second charge transistor, and a third charge transistor connected to the first wiring, the second wiring, and the third wiring, respectively, for precharging the first wiring, the second wiring, and the third wiring, respectively.

5. The semiconductor storage device according to claim 1, further comprising:
a fifth latch circuit connected to the second wiring.

6. The semiconductor storage device according to claim 1, further comprising:
a fifth latch circuit electrically connected to the sense amplifier;
a fourth wiring connected to the fifth latch circuit and between the second wiring and the fourth wiring; and
a fourth switch transistor between the fourth wiring and the third wiring, wherein
the third switch transistor is between the third wiring and the second wiring.

7. The semiconductor storage device according to claim 1, further comprising:
a compression circuit connected to the second wiring and configured to compress data stored in the third latch circuit.

8. A semiconductor storage device comprising:
a plurality of memory strings;
a plurality of bit lines, each connected to one of the memory strings;
a plurality of sense amplifier units, each connected to one of the bit lines; and
a cache memory, wherein each of the sense amplifier units includes:
a sense amplifier;
first, second, third, and fourth latch circuits that are each connected to the sense amplifier;
a first wiring connected to the sense amplifier, the first latch circuit, and the second latch circuit;
a second wiring connected to the third latch circuit;
a third wiring connected to the cache memory;
a first switch transistor between the first wiring and the third wiring;
a second switch transistor between the first wiring and the second wiring; and
a third switch transistor between the second wiring and the third wiring.

9. The semiconductor storage device according to claim 8, further comprising:
a compression circuit connected to the second wiring of each of the sense amplifier units and configured to compress data stored in the third latch circuit of each of the sense amplifier units.

10. The semiconductor storage device according to claim 8, wherein each of the sense amplifier units further includes:
a first charge transistor, a second charge transistor, and a third charge transistor connected to the first wiring, the second wiring, and the third wiring, respectively, for precharging the first wiring, the second wiring, and the third wiring, respectively.

11. The semiconductor storage device according to claim 8, wherein each of the sense amplifier units further includes:
a fifth latch circuit connected to the second wiring.

12. The semiconductor storage device according to claim 8, wherein each of the sense amplifier units further includes:
a fifth latch circuit electrically connected to the sense amplifier;
a fourth wiring connected to the fifth latch circuit and between the second wiring and the fourth wiring; and
a fourth switch transistor between the fourth wiring and the third wiring, wherein
the third switch transistor is between the third wiring and the second wiring.

13. A method of performing a read operation in a semiconductor storage device that includes a memory string, a bit line connected to the memory string, a sense amplifier connected to the bit line, first, second, third, and fourth latch circuits connected to the sense amplifier, a first wiring connected to the sense amplifier, the first latch circuit, and the second latch circuit, a second wiring connected to the third latch circuit, and a third wiring connected to the fourth latch circuit, said method comprising:
at a first timing of a read operation, performing a first sense operation while cutting off a first electrical path between the first wiring and the second wiring, a second electrical path between the second wiring and the third wiring, and a third electrical path between the first wiring and the third wiring; and
at a second timing of the read operation, that is later than the first timing, performing a second sense operation while cutting off the first electrical path between the first wiring and the second wiring, the second electrical path between the second wiring and the third wiring, and the third electrical path between the first wiring and the third wiring, wherein
first data is transferred into the first latch circuit during the first sense operation, and second data is transferred into the second latch circuit during the second sense operation.

14. The method according to claim 13, wherein the semiconductor storage device further includes:
a first switch transistor between the first wiring and the third wiring;
a second switch transistor between the first wiring and the second wiring; and
a third switch transistor between the second wiring and the third wiring, and wherein
the first, second, and third electrical paths are cut off by respectively turning OFF the first, second, and third switch transistors.

15. The method according to claim 14, further comprising:
transferring data stored in the first latch circuit to the fourth latch circuit via the first wiring and the third wiring at a third timing of the read operation, that is later than the second timing;
transferring data stored in the second latch circuit to the third latch circuit via the first wiring and the second wiring at a fourth timing of the read operation, that is later than the third timing; and
transferring data stored in the third latch circuit to the fourth latch circuit via the second wiring and the third wiring at a fifth timing of the read operation, that is later than the fourth timing.

16. The method according to claim 15, wherein:
the data stored in the first latch circuit is transferred to the fourth latch circuit via the first wiring and the third wiring by turning ON the first switch transistor and turning OFF the second and third switch transistors;
the data stored in the second latch circuit is transferred to the third latch circuit via the first wiring and the second wiring by turning ON the second switch transistor and turning OFF the first and third switch transistors; and
the data stored in the third latch circuit is transferred to the fourth latch circuit via the second wiring and the third wiring by turning ON the third switch transistor and turning OFF the first and second switch transistors.

17. The method according to claim 16, wherein
the data is transferred from the third latch circuit to the fourth latch circuit in response to an input of a transfer command.

18. The method according to claim 17, further comprising:
compressing data stored in the third latch circuit prior to transferring to the fourth latch circuit.

19. The method according to claim 13, further comprising:
precharging one of the first, second, and third wirings by respectively turning ON a respective one of first, second, and third charge transistors that are connected respectively to the first, second, and third wirings.

* * * * *